US011404007B2

(12) United States Patent
Zeng et al.

(10) Patent No.: US 11,404,007 B2
(45) Date of Patent: Aug. 2, 2022

(54) DISPLAY SUBSTRATE HAVING A SCAN DRIVING CIRCUIT WITH A PLURALITY OF SHIFT REGISTERS AND MANUFACTURING METHOD THEREOF

(71) Applicants: Chengdu BOE Optoelectronics Technology Co., Ltd., Sichuan (CN); BOE TECHNOLOGY GROUP CO., LTD., Beijing (CN)

(72) Inventors: Chao Zeng, Beijing (CN); Weiyun Huang, Beijing (CN); Yue Long, Beijing (CN); Yao Huang, Beijing (CN); Meng Li, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 85 days.

(21) Appl. No.: 16/771,446

(22) PCT Filed: Aug. 21, 2019

(86) PCT No.: PCT/CN2019/101834
§ 371 (c)(1),
(2) Date: Jun. 10, 2020

(87) PCT Pub. No.: WO2021/031166
PCT Pub. Date: Feb. 25, 2021

(65) Prior Publication Data
US 2021/0407426 A1 Dec. 30, 2021

(51) Int. Cl.
G09G 3/3266 (2016.01)
(52) U.S. Cl.
CPC ... G09G 3/3266 (2013.01); G09G 2310/0286 (2013.01)

(58) Field of Classification Search
CPC .................................................. G09G 3/3266
(Continued)

(56) References Cited

U.S. PATENT DOCUMENTS 8,004,624 B2  8/2011 Kil
9,589,536 B2  3/2017 Liu et al.
(Continued)

FOREIGN PATENT DOCUMENTS

CN  103928003 A  7/2014
CN  104536627 A  4/2015
(Continued)

OTHER PUBLICATIONS

Australian Office Action in Australian Application No. 2019275624 dated May 17, 2021.
(Continued)

*Primary Examiner* — Long D Pham
(74) *Attorney, Agent, or Firm* — Collard & Roe, P.C.

(57) ABSTRACT

A display substrate and a manufacturing method thereof, and a display device are provided. The display substrate includes a base substrate, including a pixel array region and a peripheral region; and a first scan driving circuit, a plurality of power lines, a first signal line group, and a second signal line group. The first scan driving circuit includes a plurality of cascaded first shift registers; the plurality of power lines are configured to provide a plurality of power voltages to the plurality of cascaded first shift registers in the first scan driving circuit; the first signal line group includes at least one timing signal line; the second signal line group includes a first trigger signal line configured to provide a first trigger signal to a first-stage first shift register; and the first trigger signal line is between the plurality of power lines and the pixel array region.

19 Claims, 9 Drawing Sheets

(58) Field of Classification Search
USPC .......................................................... 345/204
See application file for complete search history.

(56) References Cited

U.S. PATENT DOCUMENTS

| | | | |
|---|---|---|---|
| 9,864,472 B2 | 1/2018 | Yang et al. | |
| 2004/0217935 A1* | 11/2004 | Jeon | G11C 19/28 345/100 |
| 2004/0257321 A1* | 12/2004 | Baek | G09G 5/18 345/87 |
| 2010/0097368 A1 | 4/2010 | Hwang | |
| 2016/0217871 A1 | 7/2016 | Ochiai et al. | |
| 2017/0287427 A1* | 10/2017 | Kim | G09G 3/3696 |
| 2019/0189075 A1* | 6/2019 | Kim | H01L 23/60 |
| 2019/0206293 A1 | 7/2019 | Tian et al. | |
| 2019/0229169 A1 | 7/2019 | Huang et al. | |

FOREIGN PATENT DOCUMENTS

| | | |
|---|---|---|
| CN | 205900070 U | 1/2017 |
| CN | 106782290 A | 5/2017 |
| CN | 105405381 B | 1/2018 |
| CN | 108598087 A | 9/2018 |
| CN | 108831369 A | 11/2018 |

OTHER PUBLICATIONS

Australian Office Action in Australian Application No. 2019275624, dated Nov. 12, 2020.
International Search Report of PCT/CN2019/101834 in Chinese, dated May 27, 2020.
Notice of Transmittal of the International Search Report of PCT/CN2019/101834 in Chinese, dated May 27, 2020.
Written Opinion of the International Searching Authority of PCT/CN2019/101834 in Chinese, dated May 27, 2020.

* cited by examiner

DISPLAY SUBSTRATE HAVING A SCAN DRIVING CIRCUIT WITH A PLURALITY OF SHIFT REGISTERS AND MANUFACTURING METHOD THEREOF

CROSS REFERENCE TO RELATED APPLICATIONS

This application is the National Stage of PCT/CN2019/101834 filed on Aug. 21, 2019, the disclosure of which is incorporated by reference.

TECHNICAL FIELD

The embodiments of the present disclosure relate to a display substrate and a manufacturing method thereof, and a display device.

BACKGROUND

In a field of display technology, a pixel array of display panel, such as a liquid crystal display panel or an organic light-emitting diode (OLED) display panel, generally comprises a plurality of gate lines and a plurality of data lines interleaved with the gate lines. The driving of the gate lines can be achieved by a bonding integrated driving circuit. In recent years, with the continuous improvement of a preparation process of amorphous silicon thin film transistors or oxide thin film transistors, a gate driving circuit can also be directly integrated on a thin film transistor array substrate to form a GOA (Gate driver On Array) to drive the gate lines. For example, a GOA including a plurality of cascaded shift register units may be used to provide on-off-state voltage signals (scan signals) to a plurality of rows of gate lines of the pixel array, thereby, for example, controlling the plurality of rows of gate lines to be sequentially turned on, and simultaneously, the data lines provide data signals to pixel units in a corresponding row in the pixel array, so as to form gray voltages required for respective gray scales of a display image in the respective pixel units, thereby displaying one frame image.

SUMMARY

At least one embodiment of the present disclosure provides a display substrate, comprising: a base substrate, comprising a pixel array region and a peripheral region; and a first scan driving circuit, a plurality of power lines, a first signal line group, and a second signal line group, which are in the peripheral region and located on a first side of the base substrate. The first scan driving circuit comprises a plurality of cascaded first shift registers; the plurality of power lines are configured to provide a plurality of power voltages to the plurality of cascaded first shift registers in the first scan driving circuit; the first signal line group comprises at least one timing signal line configured to provide at least one timing signal to the plurality of cascaded first shift registers in the first scan driving circuit; the second signal line group comprises a first trigger signal line configured to be connected to a first-stage first shift register of the plurality of cascaded first shift registers in the first scan driving circuit and to provide a first trigger signal to the first-stage first shift register; and the first trigger signal line is between the plurality of power lines and the pixel array region.

For example, in the display substrate provided by at least one embodiment of the present disclosure, the second signal line group is on a side of the first scan driving circuit adjacent to the pixel array region, and the first signal line group is on a side of the first scan driving circuit opposite to the side of the first scan driving circuit where the second signal line group is located.

For example, in the display substrate provided by at least one embodiment of the present disclosure, the pixel array region comprises a first display region and a second display region, and the first display region and the second display region are juxtaposed to each other and do not overlap with each other, the first scan driving circuit is connected to the first display region to drive the first display region to display, the display substrate further comprises a second scan driving circuit in the peripheral region and located on the first side of the base substrate, the second scan driving circuit and the first scan driving circuit are sequentially arranged along a scan direction of the pixel array region, and the second scan driving circuit is connected to the second display region to drive the second display region to display. The second scan driving circuit comprises a plurality of cascaded second shift registers, the second signal line group further comprises a second trigger signal line configured to be connected to a first-stage second shift register of the plurality of cascaded second shift registers in the second scan driving circuit and to provide a second trigger signal to the first-stage second shift register in the second scan driving circuit.

For example, in the display substrate provided by at least one embodiment of the present disclosure, an extension length of the first trigger signal line and an extension length of the second trigger signal line are identical to an arrangement length of the first scan driving circuit and an arrangement length of the second scan driving circuit.

For example, in the display substrate provided by at least one embodiment of the present disclosure, the first trigger signal line and the second trigger signal line are juxtaposed.

For example, in the display substrate provided by at least one embodiment of the present disclosure, the plurality of power lines comprise a first power line and a second power line, and the first power line and the second power line are configured to provide a same first power voltage.

For example, in the display substrate provided by at least one embodiment of the present disclosure, an orthographic projection of the first power line on the base substrate partially overlaps with an orthographic projection of the first scan driving circuit on the base substrate; and an orthographic projection of the second power line on the base substrate is between the orthographic projection of the first power line on the base substrate and an orthographic projection of the second signal line group on the base substrate.

For example, the display substrate provided by at least one embodiment of the present disclosure further comprises at least one first resistor, the first resistor is on a side, away from the first-stage first shift register, of the first scan driving circuit, and the first trigger signal line is connected to the first-stage first shift register of the first scan driving circuit through the at least one first resistor.

For example, the display substrate provided by at least one embodiment of the present disclosure further comprises at least one second resistor, the second resistor is between a last-stage first shift register of the first scan driving circuit and the first-stage second shift register of the second scan driving circuit, and the second trigger signal line is connected to the first-stage second shift register of the second scan driving circuit through the at least one second resistor.

For example, in the display substrate provided by at least one embodiment of the present disclosure, a resistance value of the first resistor is different from a resistance value of the second resistor.

For example, the display substrate provided by at least one embodiment of the present disclosure further comprises a fold line between the first display region and the second display region, the second resistor is located in an extending direction of the fold line, and the extending direction of the fold line is perpendicular to an extending direction of the first signal line group and an extending direction of the second signal line group.

For example, in the display substrate provided by at least one embodiment of the present disclosure, an orthographic projection of the at least one second resistor on the base substrate is between an orthographic projection of the last-stage first shift register of the first scan driving circuit on the base substrate and an orthographic projection of the first-stage second shift register of the second scan driving circuit on the base substrate.

For example, in the display substrate provided by at least one embodiment of the present disclosure, the at least one first resistor is between the base substrate and the second signal line group in a direction perpendicular to the base substrate, and an orthographic projection of the at least one first resistor on the base substrate is on a side, away from the pixel array region, of an orthographic projection of the second signal line group on the base substrate.

For example, in the display substrate provided by at least one embodiment of the present disclosure, a material of the first resistor comprises a semiconductor material.

For example, the display substrate provided by at least one embodiment of the present disclosure further comprises at least one first connection line and at least one second connection line, the first connection line connects one terminal of the at least one first resistor to the first-stage first shift register of the first scan driving circuit, and the second connection line connects other terminal of the at least one first resistor to the first trigger signal line.

For example, in the display substrate provided by at least one embodiment of the present disclosure, the first connection line and the second connection line are on a side, away from the base substrate, of the at least one first resistor.

For example, the display substrate provided by at least one embodiment of the present disclosure further comprises a first conductive connection portion, a second conductive connection portion, a first insulation layer, and a second insulation layer, the first conductive connection portion and the second conductive connection portion are on a side, away from the base substrate, of the first connection line and the second connection line, and are in a same layer as the plurality of power lines, the first signal line group, and the second signal line group; the first insulation layer is between the at least one first resistor and the first connection line or between the at least one first resistor and the second connection line in a direction perpendicular to the base substrate, the second insulation layer is between the first connection line and the first conductive connection portion, or between the first connection line and the second conductive connection portion, or between the second connection line and the first conductive connection portion, or between the second connection line and the second conductive connection portion in the direction perpendicular to the base substrate; one terminal of the first conductive connection portion is connected to one terminal of the first connection line through a hole penetrating through the second insulation layer, and other terminal of the first conductive connection portion is connected to one terminal of the at least one first resistor through a hole penetrating through the first insulation layer and the second insulation layer; other terminal of the first connection line is connected to the first-stage first shift register of the first scan driving circuit; one terminal of the second conductive connection portion is connected to one terminal of the second connection line through a hole penetrating through the second insulation layer, and other terminal of the second conductive connection portion is connected to other terminal of the at least one first resistor through a hole penetrating through the first insulation layer and the second insulation layer; and other terminal of the second connection line is connected to the first trigger signal line through a hole penetrating through the second insulation layer.

For example, in the display substrate provided by at least one embodiment of the present disclosure, each of the plurality of cascaded first shift registers of the first scan driving circuit comprises a first constituting transistor which is connected to the first power line and comprises a second constituting transistor and a third constituting transistor which are connected to the second power line, an orthographic projection of the first constituting transistor on the base substrate is between an orthographic projection of the first signal line group on the base substrate and an orthographic projection of the first power line on the base substrate, and is close to the orthographic projection of the first power line on the base substrate, an orthographic projection of the second constituting transistor on the base substrate and an orthographic projection of the third constituting transistor on the base substrate are between the orthographic projection of the first power line on the base substrate and an orthographic projection of the second power line on the base substrate, and is close to the orthographic projection of the second power line on the base substrate.

For example, in the display substrate provided by at least one embodiment of the present disclosure, the plurality of power lines comprise a third power line and a fourth power line, the third power line and the fourth power line are configured to provide a same second power voltage; an orthographic projection of the fourth power line on the base substrate partially overlaps with an orthographic portion of the first scan driving circuit on the base substrate; an orthographic projection of the third power line on the base substrate is between the orthographic projection of the fourth power line on the base substrate and an orthographic projection of the first signal line group on the base substrate.

For example, in the display substrate provided by at least one embodiment of the present disclosure, each of the plurality of cascaded first shift registers of the first scan driving circuit further comprises a fourth constituting transistor connected to the third power line and a fifth constituting transistor connected to the fourth power line, an orthographic projection of the fourth constituting transistor on the base substrate is on a side, away from the orthographic projection of the first signal line group on the base substrate, of the orthographic projection of the third power line on the base substrate, and is close to the orthographic projection of the third power line on the base substrate, an orthographic projection of the fifth constituting transistor on the base substrate is between the orthographic projection of the fourth power line on the base substrate and an orthographic projection of the second signal line group on the base substrate, and is close to the orthographic projection of the fourth power line on the base substrate.

At least one embodiment of the present disclosure provides a display substrate, comprising: a base substrate, comprising a pixel array region and a peripheral region, and a first scan driving circuit, a plurality of power lines, a first signal line group, and a second signal line group, which are in the peripheral region and located on a first side of the base substrate. The first scan driving circuit comprises a plurality of cascaded first shift registers; the plurality of power lines are configured to provide a plurality of power voltages to the plurality of cascaded first shift registers in the first scan driving circuit; the first signal line group comprises at least one timing signal line configured to provide at least one timing signal to the plurality of cascaded first shift registers in the first scan driving circuit; the second signal line group comprises a first trigger signal line configured to be connected to a first-stage first shift register of the plurality of cascaded first shift registers in the first scan driving circuit and to provide a first trigger signal to the first-stage first shift register, the first scan driving circuit comprises a first transistor, a second transistor, and a third transistor, and the first transistor, the second transistor, and the third transistor are respectively connected to the first signal line group, an extending direction of a channel of the first transistor, an extending direction of a channel of the second transistor, and an extending direction of a channel of the third transistor are parallel to an extending direction of the first signal line group and an extending direction of the second signal line group.

For example, in the display substrate provided by at least one embodiment of the present disclosure, the first scan driving circuit further comprises a sixth transistor and a seventh transistor, and the sixth transistor and the seventh transistor are respectively connected to the first signal line group, an extending direction of a channel of the sixth transistor and an extending direction of a channel of the seventh transistor are parallel to the extending direction of the first signal line group and the extending direction of the second signal line group.

At least one embodiment of the present disclosure provides a display device, comprising the display substrate according to any one of the embodiments of the present disclosure.

At least one embodiment of the present disclosure provides a manufacturing method of a display substrate, comprising: providing the base substrate; and sequentially forming a semiconductor layer, a first insulation layer, a first conductive layer, a second insulation layer, a second conductive layer, a third insulation layer, and a third conductive layer on the base substrate in a direction perpendicular to the base substrate. The plurality of power lines, the first signal line group, and the second signal line group are in the third conductive layer; the first scan driving circuit is formed in the semiconductor layer, the first conductive layer, and the second conductive layer; and the first scan driving circuit is respectively connected to the plurality of power lines, the first signal line group, and the second signal line group through holes penetrating through the first insulation layer, the second insulation layer, and the third insulation layer.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

FIGS. 6B, 7B, 8, and 9B are plane diagrams showing wirings of respective layers of the first-stage shift register included in the display substrate as shown in FIG. 5B, respectively;

DETAILED DESCRIPTION

Figure 1:
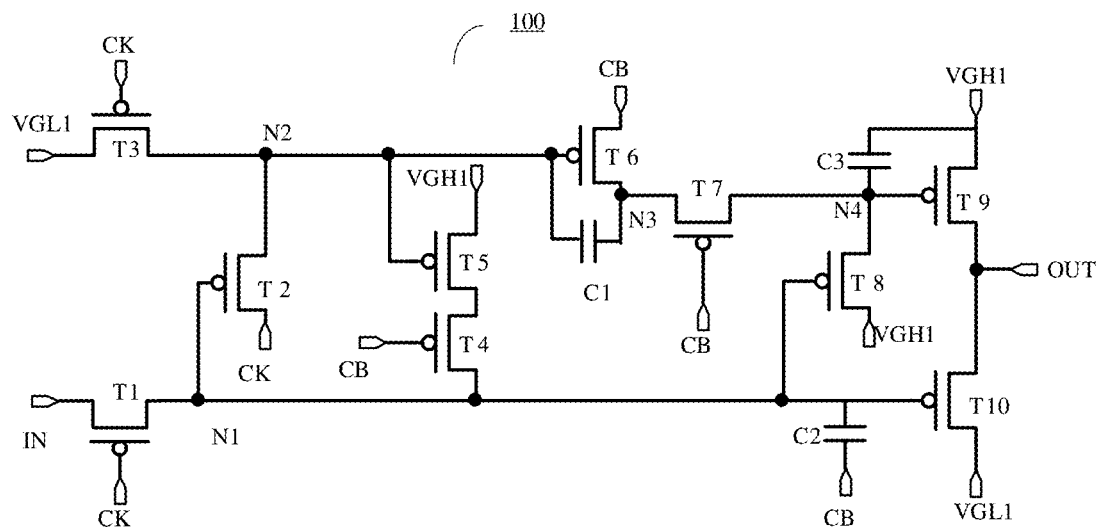
FIG. 1 is a circuit diagram of a light-emitting control shift register.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below with reference to a few specific embodiments. In order to make the following description of the embodiments of the present disclosure clear and concise, the present disclosure omits detailed description of known functions and known components. In a case where any component of an embodiment of the present disclosure appears in more than one of the drawings, the component is denoted by the same reference numeral in each of the drawings.

Figure 2:
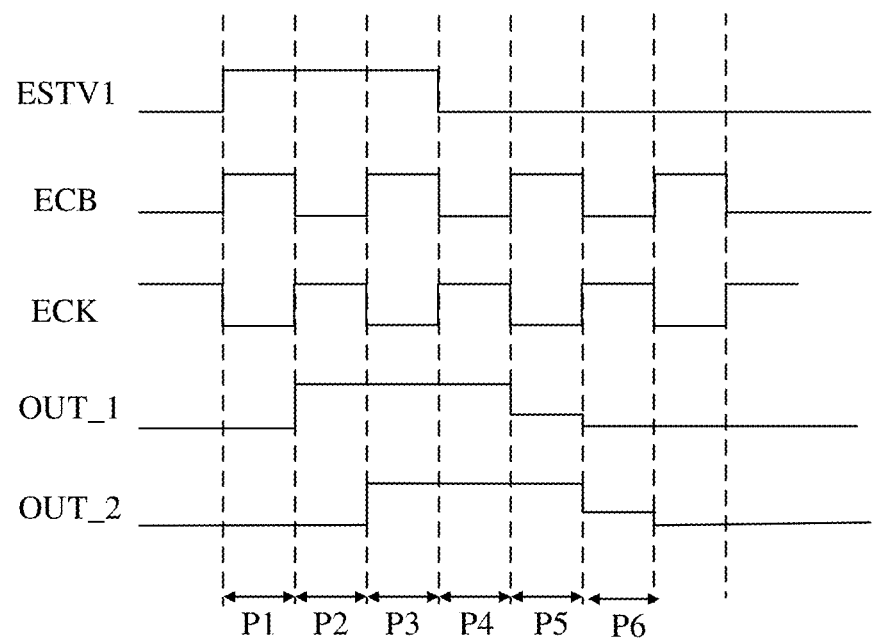
FIG. 2 is a timing diagram of signals in a case where the light-emitting control shift register as shown in FIG. 1 operates.

FIG. 1 is a circuit diagram of a light-emitting control shift register. FIG. 2 is a timing diagram of signals in a case where the light-emitting control shift register as shown in FIG. 1 operates. An operation process of the light-emitting control shift register will be briefly described below with reference to FIG. 1 and FIG. 2.

As shown in FIG. 1, the light-emitting control shift register 100 comprises ten transistors (a first transistor T1, a second transistor T2, . . . , a tenth transistor T10) and three capacitors (a first capacitor C1, a second capacitor C2, and a third capacitor C3). For example, in a case where a plurality of light-emitting control shift registers are cascaded, a first electrode of a first transistor T1 in a first-stage light-emitting control shift register 100 is configured to be connected to a first trigger signal line ESTV1 to receive a first trigger signal ESTV1, a first electrode of a first transistor T1 in each of the other stages of the light-emitting control shift registers 100 is connected to a previous-stage light-emitting control shift register 100, to receive a first output signal EM outputted by the previous-stage light-emitting control shift register 100.

In addition, in FIG. 1 and FIG. 2, CK represents a first clock signal terminal, ECK represents a first clock signal line and a first clock signal, and the first clock signal terminal CK is connected to the first clock signal line ECK to receive the first clock signal; CB represents a second clock signal terminal, ECB represents a second clock signal line and a second clock signal, and the second clock signal terminal CB is connected to the second clock signal line ECB to receive the second clock signal, for example, the first clock signal ECK and the second clock signal ECB may use a pulse signal with a duty ratio greater than 50%; and VGH1 represents a first power line and a first power voltage provided by the first power line. For example, the first power voltage is a DC high level voltage, and VGL1 represents a third power line and a second power voltage provided by the third power line, for example, the second power voltage is a DC low level voltage, and the first power voltage is greater than the second power voltage; and N1, N2, N3, and N4 represent a first node, a second node, a third node, and a fourth node, respectively.

As shown in FIG. 1, a gate electrode of the first transistor T1 is connected to the first clock signal terminal CK (i.e., the first clock signal line ECK) to receive the first clock signal, a first electrode of the first transistor T1 is connected to an input terminal IN, and a second electrode of the first transistor T1 is connected to the first node N1. For example, in a case where the light-emitting control shift register is a first-stage shift register, the input terminal IN is connected to a first trigger signal line ESTV1 to receive a first trigger signal, in a case where the light-emitting control shift register is a shift register other than the first-stage shift register, the input terminal IN of the light-emitting control shift register is connected to an output terminal OUT of the previous-stage light-emitting control shift register of the light-emitting control shift register.

A gate electrode of the second transistor T2 is connected to the first node N1, a first electrode of the second transistor T2 is connected to the first clock signal line ECK to receive the first clock signal, and a second electrode of the second transistor T2 is connected to the second node N2.

A gate electrode of a third transistor T3 is connected to the first clock signal line ECK to receive the first clock signal, a first electrode of the third transistor T3 is connected to the third power line VGL1 to receive the second power voltage, and a second electrode of the third transistor T3 is connected to the second node N2.

A gate electrode of a fourth transistor T4 is connected to the second clock signal terminal CB (i.e., the second clock signal line ECB) to receive the second clock signal, a first electrode of the fourth transistor T4 is connected to the first node N1, and a second electrode of the fourth transistor T4 is connected to a first electrode of the fifth transistor T5.

A gate electrode of a fifth transistor T5 is connected to the second node N2, and a second electrode of the fifth transistor T5 is connected to the first power line VGH to receive the first power voltage.

A gate electrode of a sixth transistor T6 is connected to the second node N2, a first electrode of the sixth transistor T6 is connected to the second clock signal line ECB to receive the second clock signal, and a second electrode of the sixth transistor T6 is connected to the third node N3.

A first terminal of the first capacitor C1 is connected to the second node N2, and a second terminal of the first capacitor C1 is connected to the third node N3.

A gate electrode of a seventh transistor T7 is connected to the second clock signal line ECB to receive the second clock signal, a first electrode of the seventh transistor T7 is connected to the third node N3, and a second electrode of the seventh transistor T7 is connected to the fourth node N4.

A gate electrode of an eighth transistor T8 is connected to the first node N1, a first electrode of the eighth transistor T8 is connected to the first power line VGH1 to receive the first power voltage, and a second electrode of the eighth transistor T8 is connected to the fourth node N4.

A gate electrode of a ninth transistor T9 is connected to the fourth node N4, a first electrode of the ninth transistor T9 is connected to the first power line VGH1 to receive the first power voltage, and a second electrode of the ninth transistor T9 is connected to the output terminal OUT.

A first terminal of the third capacitor C3 is connected to the fourth node N4, and a second terminal of the third capacitor C3 is connected to the first power line VGH1 to receive the first power voltage.

A gate electrode of the tenth transistor T10 is connected to the first node N1, a first electrode of the tenth transistor T10 is connected to the third power line VGL1 to receive the second power voltage, and a second electrode of the tenth transistor T10 is connected to the output terminal OUT.

A first terminal of the second capacitor C2 is connected to the second clock signal line ECB to receive the second clock signal, and a second terminal of the second capacitor C2 is connected to the first node N1.

Transistors in the light-emitting control shift register 100 as shown in FIG. 1 are all described by taking P-type transistors as an example, that is, each transistor is turned on in a case where a gate electrode of each transistor is connected to a low level, and each transistor is turned off in a case where the gate electrode of each transistor is connected to a high level. In this case, the first electrode may be a source electrode, and the second electrode may be a drain electrode.

The embodiment of the present disclosure comprises, but is not limited to, the configuration as shown in FIG. 1, for example, respective transistors in the light-emitting control shift register 100 as shown in FIG. 1 may also be N-type transistors or may be P-type transistors and N-type transistors, as long as port polarities of a selected-type of transistor are correspondingly connected in accordance with port polarities of a corresponding transistor in the embodiments of the present disclosure.

FIG. 2 is a timing diagram of signals in a case where the light-emitting control shift register as shown in FIG. 1 operates. An operation process of the light-emitting control shift register will be described in detail below with reference to FIG. 1 and FIG. 2. For example, an operation principle of a first-stage light-emitting control shift register 100 will be described, and the operation principle of the other stages of the light-emitting control shift registers 100 is similar to that of the first-stage light-emitting control shift register 100, and will not be described again. As shown in FIG. 2, an operation process of the light-emitting control shift register 100 comprises six phases, namely, a first phase P1, a second phase P2, a third phase P3, a fourth phase P4, a fifth phase P5, and a sixth phase P6, and FIG. 2 shows timing waveforms of respective signals in each phase.

In the first phase P1, as shown in FIG. 2, the first clock signal ECK is at a low level, so the first transistor T1 and the third transistor T3 are turned on, and the turned-on first transistor T1 transmits the high-level first trigger signal ESTV1 to the first node N1, so that a level of the first node N1 becomes a high level, so the second transistor T2, the eighth transistor T8, and the tenth transistor T10 are turned off. In addition, the turned-on third transistor T3 transmits the low-level second power voltage VGL1 to the second node N2, thereby causing a level of the second node N2 to become a low level, so the fifth transistor T5 and the sixth transistor T6 are turned on. Because the second clock signal ECB is at a high level, the seventh transistor T7 is turned off. In addition, due to the storage function of the third capacitor C3, a level of the fourth node N4 can be maintained at a high level, thereby causing the ninth transistor T9 to be turned off. In the first phase P1, because the ninth transistor T9 and the tenth transistor T10 are both turned off, a first output signal outputted from an output terminal OUT_1 of the light-emitting control shift register 100 is maintained at a previous low level.

Figure 4:
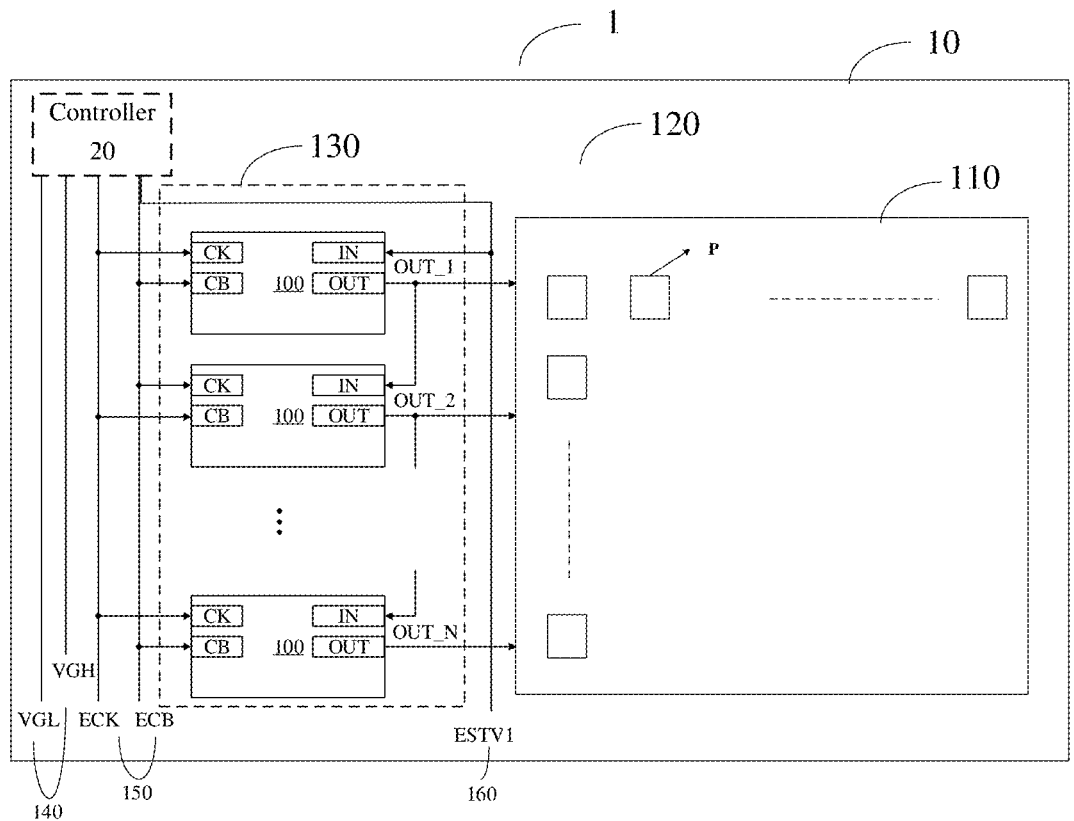
FIG. 4 is a schematic diagram of a display substrate provided by at least one embodiment of the present disclosure.

In the second phase P2, as shown in FIG. 4, the second clock signal ECB is at a low level, so the fourth transistor T4 and the seventh transistor T7 are turned on. Because the first clock signal ECK is at a high level, the first transistor T1 and the third transistor T3 are turned off. Due to the storage function of the first capacitor C1, the second node N2 can continue to remain at the low level of the previous phase, so the fifth transistor T5 and the sixth transistor T6 are turned on. The high-level first power voltage VGH1 is transmitted to the first node N1 through the turned-on fifth transistor T5 and the turned-on fourth transistor T4, so that the level of the first node N1 continues to remain at the high level of the previous phase, so the second transistor T2, the eighth transistor T8, and the tenth transistor T10 are turned off. In addition, the low-level second clock signal ECB is transmitted to the fourth node N4 through the turned-on sixth transistor T6 and the turned-on seventh transistor T7, so that the level of the fourth node N4 becomes a low level, so the ninth Transistor T9 is turned on, the turned-on ninth transistor T9 outputs the high-level first power voltage VGH1, so that the first output signal outputted from the output terminal OUT_1 of the light-emitting control shift register 100 in the second phase P2 is at a high level.

In the third phase P3, as shown in FIG. 4, the first clock signal ECK is at a low level, so the first transistor T1 and the third transistor T3 are turned on. The second clock signal ECB is at a high level, so the fourth transistor T4 and the seventh transistor T7 are turned off. Due to the storage function of the third capacitor C3, the level of the fourth node N4 can be maintained at the low level of the previous phase, so that the ninth transistor T9 remains to be turned on, the turned-on ninth transistor T9 outputs the high-level first power voltage VGH1, so that the first output signal outputted from the output terminal OUT_1 of the light-emitting control shift register 100 in the third phase P3 is still at a high level. At the same time, in this phase, an output terminal OUT_2 of a second-stage light-emitting control shift register 100 outputs a high level signal (a detailed description of the second-stage light-emitting control shift register 100 may refer to the working process of the first-stage light-emitting control shift register in the second phase P2 described above).

In the fourth phase P4, as shown in FIG. 4, the first clock signal ECK is at a high level, so the first transistor T1 and the third transistor T3 are turned off. The second clock signal ECB is at a low level, so the fourth transistor T4 and the seventh transistor T7 are turned on. Due to the storage function of the second capacitor C2, the level of the first node N1 remains to be the high level of the previous phase, so that the second transistor T2, the eighth transistor T8, and the tenth transistor T10 are turned off. Due to the storage function of the first capacitor C1, the second node N2 continues to remain at the low level of the previous phase, so that the fifth transistor T5 and the sixth transistor T6 are turned on. In addition, the low-level second clock signal ECB is transmitted to the fourth node N4 through the turned-on sixth transistor T6 and the turned-on seventh transistor T7, thereby causing the level of the fourth node N4 to become a low level, and therefore, the ninth transistor T9 is turned on, the turned-on ninth transistor T9 outputs the high-level first power voltage VGH1, so that the first output signal outputted from the output terminal OUT_1 of the light-emitting control shift register 100 in the fourth phase P4 is still at a high level. At the same time, in this phase, the output terminal OUT_2 of the second-stage light-emitting control shift register 100 outputs a high level signal (a detailed description of the second-stage light-emitting control shift register 100 may refer to the working process of the first-stage light-emitting control shift register in the third phase P3 described above).

In the fifth phase P5, as shown in FIG. 4, the first clock signal ECK is at a low level, so the first transistor T1 and the third transistor T3 are turned on. The second clock signal ECB is at a high level, so the fourth transistor T4 and the seventh transistor T7 are turned off. The turned-on first transistor T1 transmits the low-level first trigger signal ESTV to the first node N1, so that the level of the first node N1 becomes a low level.

For example, in the fifth phase P5, a low-level voltage of the first clock signal ECK is −6V, and a low-level voltage of the first trigger signal ESTV1 is −6V, and a threshold voltage Vth of the first transistor T1 is −1.5V. Because the first transistor T1 is a P-type transistor, in order to turn on the first transistor T1, a voltage Vgs between the gate electrode and the source electrode of the first transistor T1 needs to be smaller than the threshold voltage Vth of the first transistor T1, and therefore, in a case where the first node N1 is charged to (−4.5)V, the first transistor T1 is turned off, and at this time, the charging of the first node N1 is stopped, that is, in this phase, the low-level voltage of the first node N1 is −4.5 V, so the second transistor T2, the eighth transistor T8, and the tenth transistor T10 are turned on. The turned-on second transistor T2 transmits the low-level first clock signal ECK to the second node N2, so that the level of the second node N2 can be further pulled down, and therefore, the second node N2 continues to remain at the low level of the previous phase, thereby causing the fifth transistor T5 and the sixth transistor T6 to be turned on. In addition, the turned-on eighth transistor T8 transmits the high-level first power voltage VGH1 to the fourth node N4, thereby causing the level of the fourth node N4 to become a high level, so the ninth transistor T9 is turned off. The turned-on tenth transistor T10 outputs the low-level second power voltage VGL (e.g., −6V) in response to a low level (e.g., −4.5V) of the first node N1, similarly, a threshold voltage Vth of the tenth transistor T10 is −1.5V, in order to turn on the tenth transistor T10, a voltage Vgs between the gate electrode and the source electrode of the tenth transistor T10 needs to be smaller than the threshold voltage Vth of the tenth transistor T10, and therefore, in a case where a voltage outputted from the output terminal OUT is −3V, the tenth transistor T10 is turned off, that is, the low-level voltage outputted from the output terminal OUT is −3V in this phase, so the output signal outputted from the output terminal OUT_1 of the light-emitting control shift register 100 in the fifth phase P5 becomes a first low level (for example, −3V). At the same time, in this phase, the output terminal OUT_2 of the second-stage light-emitting control shift register 100 outputs a high level signal (a detailed description of the second-stage light-emitting control shift register 100 may refer to the working process of the first-stage light-emitting control shift register in the fourth phase P4 described above).

In the sixth phase P6, as shown in FIG. 4, the first clock signal ECK is at a high level, and the second clock signal ECB is at a low level, so the fourth transistor T4 and the seventh transistor T7 are turned on. Because the second clock signal ECB changes from a high level in the fifth phase P5 to a low level, for example, the change amount is Δt (for example, greater than 6V), according to a bootstrap effect of the second capacitor C2, the level of the first node N1 is changed from a low level (for example, −4.5V) in the fifth phase P5 to a lower level (for example, −4.5V-Δt), so that the second transistor T2 and the tenth transistor T10 are turned on under control of the low level (for example, −4.5V-Δt) of the first node N1, according to a conduction characteristics of the tenth transistor T10 described above, the low-level second power voltage VGL (for example, −6V) can be completely output to the output terminal OUT. For example, in the sixth phase P6, the voltage outputted from the output terminal OUT is at a second low level (for example, −6V). At the same time, in this phase, the output terminal OUT_2 of the second-stage first shift register 100 outputs a low level signal (for example, −3V, and a detailed description may refer to the working process of the first-stage first shift register in the fourth phase P4 described above).

For example, as shown in FIG. 1, on a left side of the display substrate, because the wirings are dense, a space left for the first trigger signal line ESTV1 is small, which is inconvenient to introduce a plurality of trigger signal lines. In addition, as shown in FIG. 1, because there is only one first power line VGH1, and the fifth transistor T5, the eighth transistor T8, and the ninth transistor T9 need to be wound wire in order to be connected with the first power voltage line VGH1, thereby increasing the occupied space of the display substrate in a vertical direction, which is disadvantageous for the layout design of the display substrate.

At least one embodiment of the present disclosure provides a display substrate, and the display substrate comprises: a base substrate, comprising a pixel array region and a peripheral region; and a first scan driving circuit, a plurality of power lines, a first signal line group, and a second signal line group, which are in the peripheral region and located on a first side of the base substrate. The first scan driving circuit comprises a plurality of cascaded first shift registers; the plurality of power lines are configured to provide a plurality of power voltages to the plurality of cascaded first shift registers in the first scan driving circuit; the first signal line group comprises at least one timing signal line configured to provide at least one timing signal to the plurality of cascaded first shift registers in the first scan driving circuit; the second signal line group comprises a first trigger signal line configured to be connected to a first-stage first shift register of the plurality of cascaded first shift registers in the first scan driving circuit and to provide a first trigger signal to the first-stage first shift register; and the first trigger signal line is between the plurality of power lines and the pixel array region.

At least one embodiment of the present disclosure also provides a display device and a manufacturing method corresponding to the above display substrate.

In the display substrate provided by the above embodiment of the present disclosure, a first trigger signal line is disposed between the plurality of power lines and the pixel array region to facilitate the introduction of the signal lines, which is conducive to the display of a large-size display panel.

Embodiments of the present disclosure and some examples thereof will be described in detail below with reference to the accompanying drawing.

At least one embodiment of the present disclosure provides a display substrate. For example, the display substrate can be applied to a scan driving circuit that drives one row each time, that is, an output signal outputted by one-stage shift register drives only one row of pixel units. Because loads required to be driven by the scan driving circuit that drives one row each time is less than half of loads required to be driven by a scan driving circuit that drives double rows each time, and therefore, the scan driving circuit that drives one row each time has a stronger driving capability and is more suitable for the display of the large-size display panel.

It should be noted that the display substrate can also be applied to the scan driving circuit that drives double rows each time, that is, an output signal outputted by one-stage shift register can drive two rows of pixel units, and the embodiments of the present disclosure are not limited thereto.

FIG. 4 is a schematic diagram of a display substrate according to at least one embodiment of the present disclosure. For example, as shown in FIG. 4, the display substrate 1 comprises: a base substrate 10, a first scan driving circuit 130, a plurality of power lines 140, a first signal line group 150, and a second signal line group 160.

For example, the base substrate 100 may be made of, for example, glass, plastic, quartz, or other suitable materials, and the embodiments of the present disclosure do not limit the material of the base substrate 100. For example, the base substrate 10 comprises a pixel array region 110 and a peripheral region 120, the first scan driving circuit 130, the plurality of power lines 140, the first signal line group 150, and the second signal line group 160 are in the peripheral region 120 and located on a first side of the base substrate 10, for example, on a left side of the base substrate 10.

For example, the pixel array region 110 includes a plurality of pixel units P arranged in an array. For example, each of the plurality of pixel units P includes a pixel circuit, and for example, may further include a light-emitting element (not shown).

For example, the first scan driving circuit 130 comprises a plurality of cascaded first shift registers 100, for example, comprises a plurality of first shift registers 100 as shown in FIG. 1. For the sake of clarity and conciseness, the first shift register 100 will be simply referred to as a shift register 100 below. The following embodiments are the same as those described herein, and similar portions will not be described again. For example, output terminals of the plurality of shift registers 100 are respectively connected to light-emitting control terminals of respective rows of pixel circuits located in the pixel array region to provide output signals (for example, light-emitting control signals) to the respective rows of pixel circuits, thereby driving the light-emitting elements to emit light. For example, the pixel circuit may be a pixel circuit including a circuit structure of, for example, 2T1C, 4T2C, 8T2C, and the like, in the art, and details are not described herein.

For example, the first scan driving circuit 130 includes at least one transistor, and an extending direction of a channel of the at least one transistor is parallel to an extending direction of the first signal line group 150 and an extending direction of the second signal line group 160, so that an area of the first scan driving circuit 130 in a direction perpendicular to a length direction of the channel can be reduced, the process matching degree is improved, and a better channel effect is formed.

For example, the first scan driving circuit 130 includes a first transistor T1, a second transistor T2, and a third transistor T3, the first transistor T1, the second transistor T2, and the third transistor T3 are respectively connected to the first signal line group 150, for example, are connected to the first clock signal line ECK in the first signal line group 150. For example, an extending direction of a channel of the first transistor T1, an extending direction of a channel of the second transistor T2, and an extending direction of a channel of the third transistor T3 are parallel to the extending direction of the first signal line group 150 and the extending direction of the second signal line group 160. For example, an extending direction of a channel of a transistor is an extending direction from a first electrode of the transistor to a second electrode of the transistor, for example, the extending direction from the first electrode of the first transistor T1 to the second electrode of the first transistor T1.

For example, the first scan driving circuit 130 further includes a sixth transistor T6 and a seventh transistor T7, and the sixth transistor T6 and the seventh transistor T7 are respectively connected to the first signal line group 150. An extending direction of a channel of the sixth transistor T6 and an extending direction of a channel of the seventh transistor T7 are parallel to the extending direction of the first signal line group 150 and the extending direction of the second signal line group 160.

For example, the plurality of power lines 140 are configured to provide a plurality of power voltages to the plurality of cascaded shift registers 100 in the first scan driving circuit 130. For example, a first power voltage (such as, having a DC high level), a second power voltage (such as, having a DC low level), and the like are provided by the plurality of power lines 140.

The first signal line group 150 comprises at least one timing signal line, for example, comprises the first clock signal line ECK and a second clock signal line ECB, and the at least one timing signal line is configured to provide at least one timing signal, such as the first clock signal ECK and the second clock signal ECB described above, to the plurality of cascaded shift registers 100 in the first scan driving circuit 130.

For example, in at least one example, the second signal line group 160 comprises a first trigger signal line ESTV1 configured to be connected to a first-stage shift register in the plurality of cascaded shift registers 100 in the first scan driving circuit 150 and to provide a first trigger signal to the first-stage shift register. For example, the first trigger signal line ESTV1 is located between the plurality of power lines 140 and the pixel array region 110. For example, as shown in FIG. 4, the first trigger signal line ESTV1 may be located on a right side of the first scan driving circuit 130, that is, an orthographic projection of the first trigger signal line ESTV1 on the base substrate 10 is located between an orthographic projection of the first scan driving circuit 130 on the base substrate 10 and an orthographic projection of the pixel array region 110 on the base substrate 10. Of course, the first trigger signal line ESTV1 may also be located between the transistors of the first scan driving circuit 130, that is, the orthographic projection of the first trigger signal line ESTV1 on the base substrate 10 and the orthographic projection of the first scan driving circuit 130 on the base substrate 10 at least partially overlap with each other, as long as it can be satisfied that the first trigger signal line ESTV1 is disposed in an area where the wirings are not dense, so as to facilitate the introduction of the trigger signal line, and the embodiments of the present disclosure are not limited thereto.

It should be noted that the display substrate may further comprise a plurality of scan driving circuits, and a plurality of trigger signal lines respectively connected to first-stage shift registers of the plurality of scan driving circuits, and the embodiments of the present disclosure do not limit this case.

For example, in some examples, in a case where the display substrate further includes a plurality of scan driving circuits, such as a second scan driving circuit, a third scan driving circuit, and the like, the display substrate further includes a plurality of trigger signal line, such as a second trigger signal line ESTV2 connected to a first-stage shift register of the second scan driving circuit and a third trigger signal line connected to a first-stage shift register of the third scan driving circuit. For example, the plurality of scan driving circuits, such as the second scan driving circuit and the third scan driving circuit, have the same structure as the first scan driving circuit, and the first scan driving circuit and the plurality of scan driving circuits, such as the second scan driving circuit and the third scan driving circuit, are sequentially arranged to jointly drive the pixel array region of the display substrate. For example, the pixel array region includes a plurality of display regions that do not overlap with each other (for example, are juxtaposed), and the plurality of scan driving circuits, such as the first scan driving circuit, the second scan driving circuit, and the third scan driving circuit, respectively drive the display regions corresponding thereto.

For example, in a case where the plurality of scan driving circuits are included, the second signal line group 160 further includes a plurality of trigger signal lines. For example, the plurality of trigger signal lines may be located between the plurality of power lines 140 and the pixel array region 110, for example, may be located on the right side of the respective scan driving circuits or may at least partially overlap with the respective scan driving circuits, as long as it can be satisfied that the plurality of trigger signal lines are disposed in an area where the wirings are not dense, so as to facilitate the introduction of the trigger signal lines, and the embodiments of the present disclosure are not limited thereto.

The display substrate provided by the above embodiment of the present disclosure, by adjusting the position of the first trigger signal line, avoids the problems, such as the inability to introduce more signal lines and the winding connection due to the dense wirings, and is more advantageous for implementing the narrow frame design of the display panel, thereby facilitating to achieve the display of the large-sized display panel.

Figure 5A:
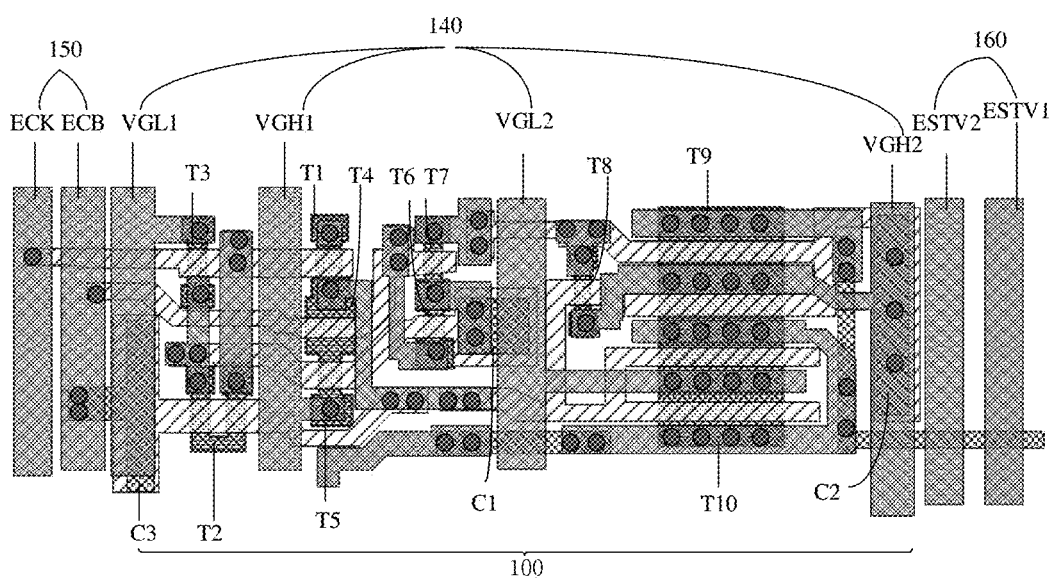
FIG. 5A is a schematic diagram showing a layout of a display substrate provided by at least one embodiment of the present disclosure.
Figure 5B:
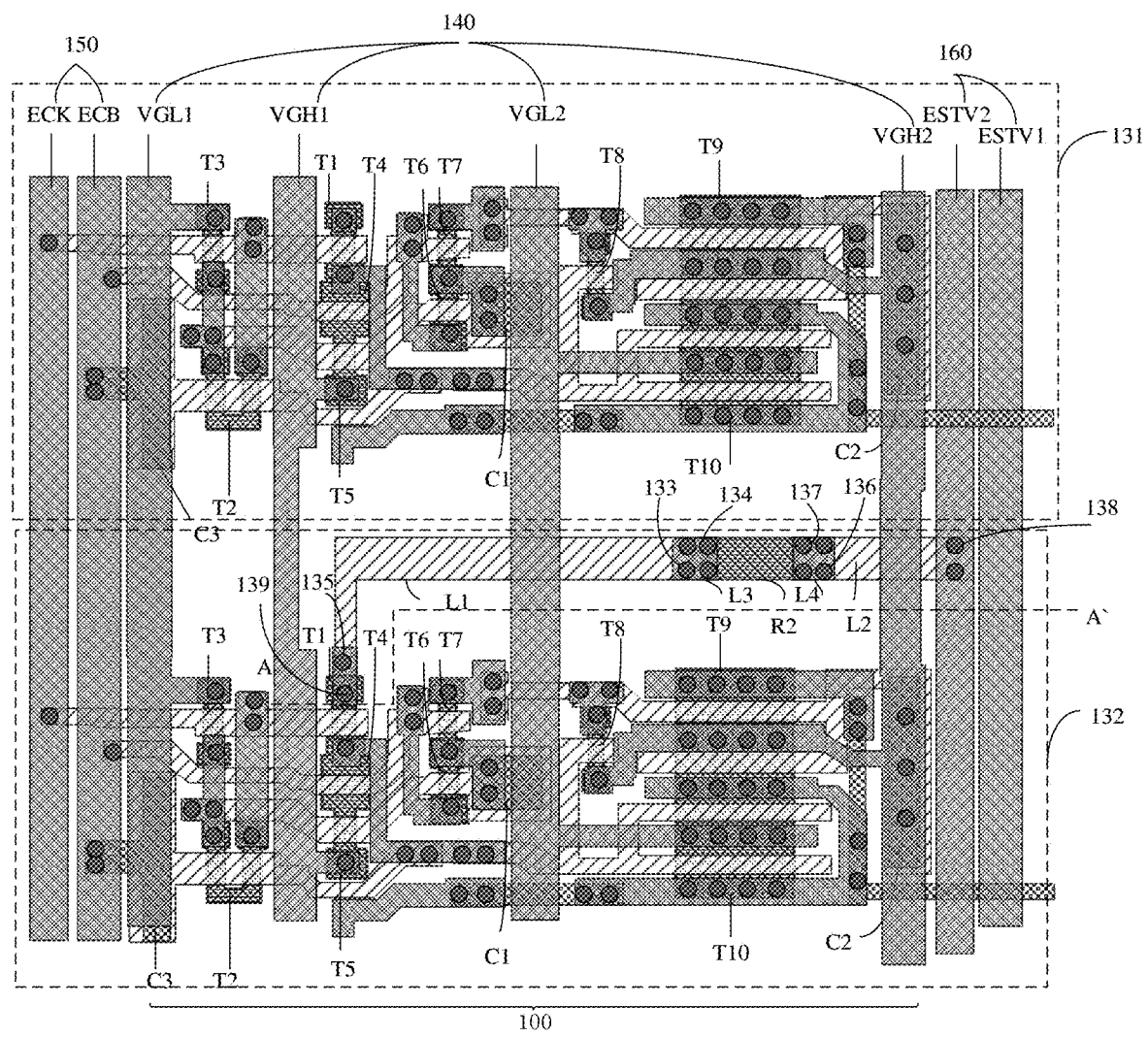
FIG. 5B is a schematic diagram showing a layout of a display substrate including a first-stage shift register of a second scan driving circuit.
Figure 10:
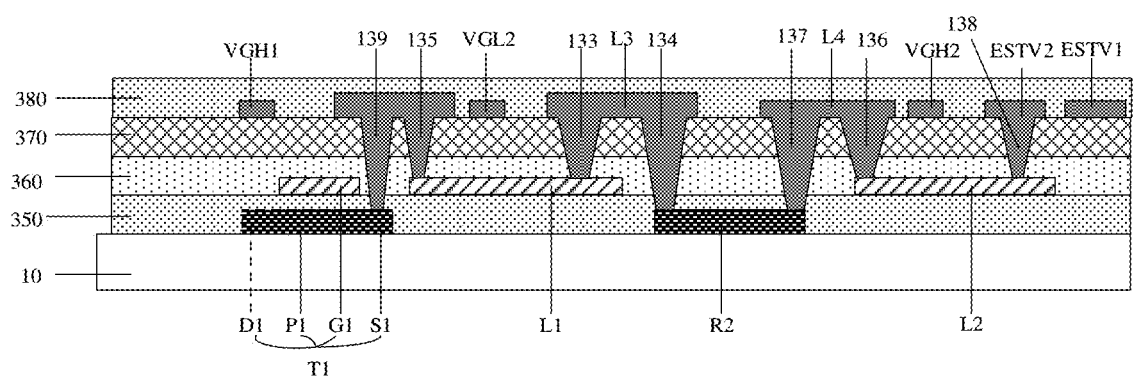
FIG. 10 is a cross-sectional view of the display substrate as shown in FIG. 5B taken along a line A-A'.

FIG. 5A is a schematic diagram showing a layout of a display substrate according to at least one embodiment of the present disclosure. FIG. 5B is a schematic diagram showing a layout of a display substrate including a first-stage shift register of a second scan driving circuit. FIG. 10 is a cross-sectional view of the display substrate as shown in FIG. 5B taken along a line A-A'. Of course, FIG. 10 can also be used to explain a stacked structure as shown in FIG. 5A.

It should be noted that the stacked structure of the first-stage shift register as shown in FIG. 5B can be applied to the first-stage shift register of each scan driving circuit, provided that the connection between the first-stage shift register of each scan driving circuit and a corresponding trigger signal can be changed, that is, the first-stage shift register of the first scan driving circuit is connected to the first trigger signal line ESTV1, the first-stage shift register of the second scan driving circuit is connected to the second trigger signal line ESTV2, . . . , and so on.

Figure 6A:
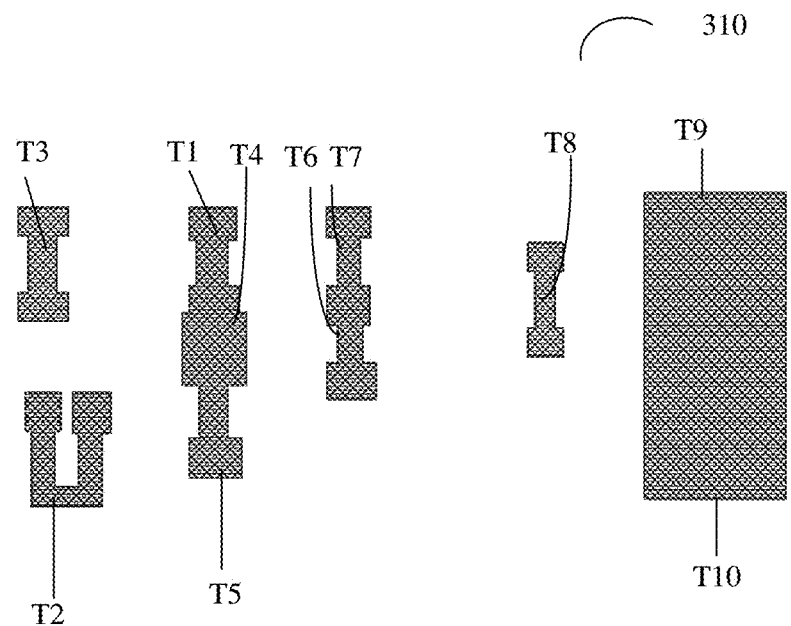
FIGS. 6A, 7A, 8, and 9A are plane diagrams showing wirings of respective layers of the display substrate as shown in FIG. 5A, respectively.
Figure 7A:
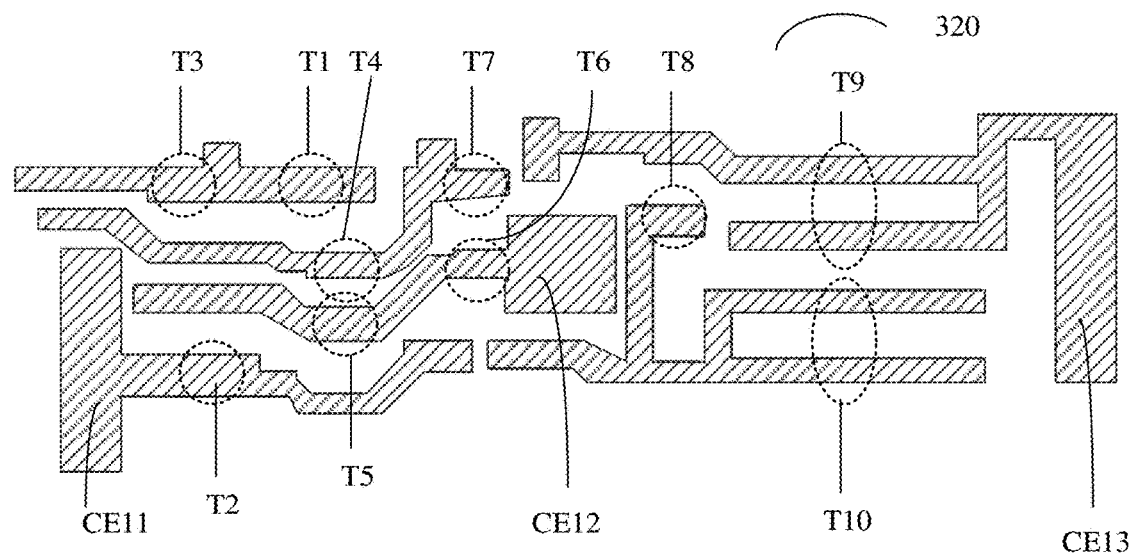
Figure 8:
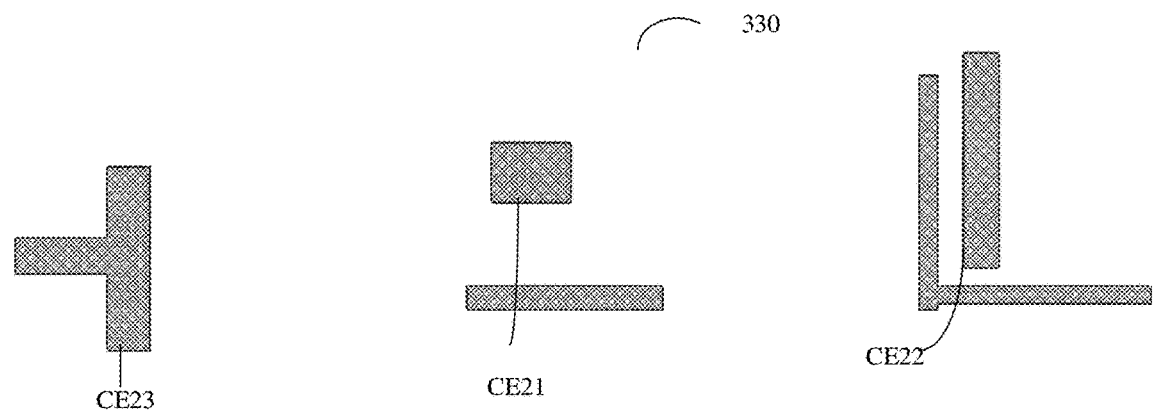
Figure 9A:
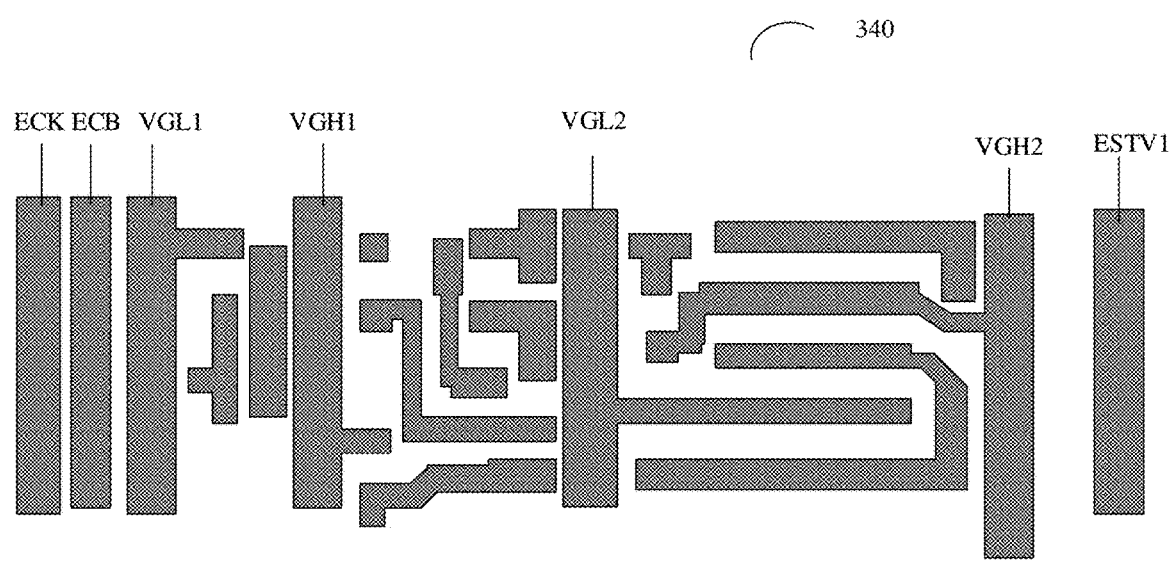

FIGS. 6A, 7A, 8, and 9A are plane diagrams showing wirings of respective layers of the display substrate as shown in FIG. 5A, respectively. FIG. 6A is a plane diagram showing a semiconductor layer of a display substrate according to at least one embodiment of the present disclosure, FIG. 7A is a plane diagram showing a first conductive layer of a display substrate according to at least one embodiment of the present disclosure, FIG. 8A is a plane diagram showing a second conductive layer of a display substrate according to at least one embodiment of the present disclosure, and FIG. 9A is a plane diagram showing a third conductive layer of a display substrate according to at least one embodiment of the present disclosure.

For example, interlayer insulation layers (for example, comprising a first insulation layer, a second insulation layer, and a third insulation layer) may be located among the layer structures as shown in FIG. 6A to FIG. 9A. For example, the first insulation layer 350 (as shown in FIG. 10) is located between the semiconductor layer 310 as shown in FIG. 6A and the first conductive layer 320 as shown in FIG. 7A, the second insulation layer 360 (as shown in FIG. 10) is located between the first conductive layer 320 as shown in FIG. 7A and the second conductive layer 330 as shown in FIG. 8, and the third insulation layer 370 (shown in FIG. 10) is located between the second conductive layer 330 as shown in FIG. 8 and the third conductive layer 340 as shown in FIG. 9A.

For example, as shown in FIG. 10, the display substrate further comprises a fourth insulation layer 380, and the fourth insulation layer 380 is located on the third conductive layer 340 and configured to protect the third conductive layer 340.

For example, materials of the first insulation layer 350, the second insulation layer 360, the third insulation layer 370, and the fourth insulation layer 380 may comprise an inorganic insulation material, such as SiNx, SiOx, SiNxOy, an organic insulation material, such as an organic resin, or other suitable material, and the embodiments of the present disclosure are not limited thereto.

It should be noted that, the display substrate as shown in FIG. 5A is described by taking a layout design of a shift register in the first scan driving circuit and a signal line connected to the shift register as an example, layout implementations of the remaining stages of the shift registers may refer to the layout implementation as shown in FIG. 5A, and details are not described herein. Of course, the remaining stages of the shift registers may also adopt other layout implementations, and the embodiments of the present disclosure do not limit the layout implementations of the remaining stages of the shift registers.

The display substrate provided by at least one embodiment of the present disclosure will be described in detail below with reference to FIGS. 5A-9A.

For example, a first transistor T1 to a tenth transistor T10 of the shift register 100 as shown in FIG. 5A may be formed on the semiconductor layer 310 as shown in FIG. 6A. The semiconductor layer 310 may be patterned using a semiconductor material. For example, as shown in FIG. 6A, the semiconductor layer 310 may have a short rod shape or a curved or bent shape as needed, and may be used to form active layers of the first transistor T1 to the tenth transistor T10 described above. Each of the active layers may comprises a source region, a drain region, and a channel region between the source region and the drain region. For example, the channel region may be doped with impurities to have semiconductor characteristics; the source region and the drain region are located on both sides of the channel region, and may be doped with impurities and thus have conductivity. For example, the source region corresponds to a source electrode (or the first electrode) of the transistor, and the drain region corresponds to a drain electrode (or the second electrode) of the transistor. For example, as shown in FIG. 10, taking the first transistor T1 as an example, an active layer of the first transistor T1 comprises a source region S1, a drain region D1 (shown by a dotted line in FIG. 10), and a channel region P1, the first transistor T1 further comprises a gate electrode G1, the gate electrode G1 is located in the first conductive layer 320 which will be described below and will not be described herein. It should be noted that the drain region D1 of the first transistor is not shown in the cross-sectional view along the A-A' direction of FIG. 5B. In order to ensure a clear description, the drain region D1 of the first transistor T1 is added with a dotted line in FIG. 10.

For example, a material of the semiconductor layer 310 may comprise an oxide semiconductor, an organic semiconductor, or amorphous silicon, polysilicon, or the like. For example, the oxide semiconductor comprises a metal oxide semiconductor (for example, indium gallium zinc oxide (IGZO)), the polysilicon comprises low temperature polysilicon or high temperature polysilicon, and the embodiments of the present disclosure do not limit the material of the semiconductor layer 310. It should be noted that the above-mentioned source region and drain region may be regions doped with n-type impurities or p-type impurities, and embodiments of the present disclosure do not limit this case.

It should be noted that in other examples, the first electrode and the second electrode of each transistor may also be located in other conductive layer, and are connected to a corresponding active layer via holes located in an insulation layer between the other conductive layer and the semiconductor layer, and the embodiments of the present disclosure do not limit this case.

FIG. 7A shows a first conductive layer 320 of the display substrate, the first conductive layer 320 is disposed on the first insulation layer, so that the first conductive layer 320 is insulated from the semiconductor layer 310. For example, the first conductive layer 320 may comprise first electrodes CE11, CE12, CE13 of a first capacitor C1 to a third capacitor C3 and gate electrodes of the first transistor T1 to the tenth transistor T10, and accordingly the first insulation layer is also referred to as a gate insulation layer. As shown in FIG. 7A, the gate electrodes of the first transistor T1 to the tenth transistor T10 are respectively overlapping portions of the semiconductor layer structures of the respective transistors and the wirings in the first conductive layer 320.

FIG. 8 shows a second conductive layer 330 of the display substrate, and the second conductive layer 330 includes second electrodes CE21, CE22, and CE23 of the first capacitor C1 to the third capacitor C3. For example, the second electrode CE21 at least partially overlaps with the first electrode CE11 to form the first capacitor C1, the second electrode CE22 at least partially overlaps with the first electrode CE12 to form the second capacitor C2, and the second electrode CE23 at least partially overlaps with the first electrode CE13 to form the third capacitor C3.

FIG. 9A shows a third conductive layer 340 of the display substrate, and the third conductive layer 340 comprises the first signal line group 150, the plurality of power lines 140, and the second signal line group 160. It should be noted that the third conductive layer further comprises conductive connection portions for connecting the respective transistors, the capacitors, and the signal lines. As shown in FIGS. 5A and 9A, the first signal line group 150, the plurality of power lines 140, and the second signal line group 160 are connected to transistors, which need to be connected to the first signal line group 150, the plurality of power lines 140, and the second signal line group 160, in the remaining layers through at least one hole, and the transistors are also connected through at least one hole or are bridge-connected through conductive connection portions, and details will not be described herein again.

For example, a material of the above-described third conductive layer 340 may comprise aluminum, aluminum alloy, copper, copper alloy, or any other suitable material, which is not limited by the embodiments of the present disclosure. For example, a material of the first conductive layer 320 and a material of the second conductive layer 330 may be the same as a material of the third conductive layer 340, and details are not described herein again.

FIG. 5A is a schematic diagram showing a stacked positional relationship of the semiconductor layer 310 as shown in FIG. 6A, the first conductive layer 320 as shown in FIG. 7A, the second conductive layer 330 as shown in FIG. 8, and the third conductive layer 340 as shown in FIG. 9A.

As shown in FIG. 5A and FIG. 9A, in at least one example, the display substrate comprises the first signal line group 150 (e.g., comprising the first clock signal line ECK and the second clock signal line ECB), the plurality of power lines 140 (e.g., comprising a third power line VGL1, the first power line VGH1, and the fourth power line VGL2), and the second signal line group 160 (for example, comprising the first trigger signal line ESTV1), and the first signal line group 150, the plurality of power lines 140, and the second signal line group 160 are sequentially disposed in a row direction. It should be noted that, in a case where the display substrate comprises the second scan driving circuit, for example, the second signal line group 160 further comprises a second trigger signal line ESTV2.

In some embodiments, as shown in FIG. 4 or FIG. 5A, the second signal line group 160 is located on a side of the first scan driving circuit 130 adjacent to the pixel array region 110, and the first signal line group 150 is located on the other side of the first scan driving circuit 130 opposite to the side where the second signal line group 160 is located. For example, as shown in FIG. 4 or FIG. 5A, the second signal line group 160 is located on a right side of the shift register 100, and the first signal line group 150 is located on a left side of the shift register 100.

In the embodiment, by disposing the second signal line group 160 comprising the first trigger signal line ESTV1 and the second trigger signal line ESTV2 on the right side of the shift register, that is, the second signal line group 160 is separately disposed from the first signal line group 150 and the plurality of power lines 140, so as to avoid the dense wirings caused by too many signal lines disposed on the left side, thereby avoiding the problem that the space left for the trigger signal lines is too small due to the dense wirings to affect the introduction of other signal lines.

In some other examples, as shown in FIG. 5A, the plurality of power lines 140 comprise a first power line VGH1, a second power line VGH2, a third power line VGL1, and a fourth power line VGL2. For example, the first power line VGH1 and the second power line VGH2 provide the same first power voltage, for example, a DC high voltage.

For example, an orthographic projection of the first power line VGH1 on the base substrate 10 partially overlaps with an orthographic projection of the first scan driving circuit on the base substrate 10; and an orthographic projection of the second power line VGH2 on the base substrate 10 is located between the orthographic projection of the first power line VGH1 on the base substrate 10 and an orthographic projection of the second signal line group 160 on the base substrate 10.

It should be noted that the orthographic projection of the first scan driving circuit on the base substrate 10 is not a continuous area, and therefore, the orthographic projection of the first power line VGH1 on the base substrate 10 only needs to overlap with an orthographic projection of a portion of the transistors or the capacitors of the first scan driving circuit on the base substrate 10. The embodiments of the present disclosure are not limited thereto. For example, as shown in FIG. 5A, the orthographic projection of the first power line VGH1 on the base substrate 10 overlaps with wirings of the first conductive layer 320, for example, the orthographic projection of the first power line VGH1 on the base substrate 10 partially overlaps with a wiring connecting the gate electrode of the third transistor T3 and the gate electrode of the first transistor T1, a wiring connecting the gate electrode of the fourth transistor T4, a wiring connecting the gate electrode of the fifth transistor T5, and a wiring connecting the gate electrode of the second transistor T2.

For example, as shown in FIG. 5A, each shift register of the first scan driving circuit comprises a first constituting transistor which is connected to the first power line VGH1, and a second constituting transistor and a third constituting transistor which are connected to the second power line VGH2. For example, the fifth transistor T5 is an example of the first constituting transistor, the eighth transistor T8 is an example of the second constituting transistor, and the ninth transistor T9 is an example of the third constituting transistor. Hereinafter, the present disclosure is described by taking a case that the first constituting transistor is the fifth transistor T5, the second constituting transistor is the eighth transistor T8, and the third constituting transistor is the ninth transistor T9 as an example, and the embodiments of the present disclosure do not limit this case. The following embodiments are the same as those described herein and will not be described again.

For example, an orthographic projection of the fifth transistor T5 on the base substrate 10 is located between an orthographic projection of the first signal line group 150 on the base substrate 10 and an orthographic projection of the first power line VGH1 on the base substrate, and is close to the orthographic projection of the first power line VGH1 on the base substrate, an orthographic projection of the eighth transistor T8 and an orthographic projection of the ninth transistor T9 on the base substrate 10 are located between the orthographic projection of the first power line VGH1 on the base substrate 10 and an orthographic projection of the second power line VGH2 on the base substrate 10, and is close to the orthographic projection of the second power line VGH2 on the base substrate 10. That is, the first power line VGH1 is disposed at a position close to the fifth transistor T5, and the eighth transistor T8 and the ninth transistor T9 are disposed at a position close to the second power line VGH2, so that the winding caused by the connection of the fifth transistor T5, the eighth transistor T8, and the ninth transistor T9 to one power line (for example, the first power line VGH1) can be avoided, thereby avoiding the space of the display substrate in a vertical direction from being occupied due to the winding.

For example, the third power line VGL1 and the fourth power line VGL2 are configured to provide the same second power voltage, for example, a DC low voltage. For example, the first power voltage is higher than the second power voltage. For example, an orthogonal projection of the fourth power line VGL2 on the base substrate 10 partially overlaps with an orthographic projection of the first scan driving circuit on the base substrate 10, an orthographic projection of the third power line VGL1 on the base substrate 10 is located between the orthographic projection of the first power line VGH1 on the base substrate 10 and the orthographic projection of the first signal line group 150 on the substrate base 10.

As described above, the orthographic projection of the first scan driving circuit on the base substrate 10 is not a continuous area, and therefore, the orthographic projection of the fourth power line VGL2 on the base substrate 10 only needs to partially overlap with orthographic projections of parts of the transistors or the capacitors of the first scan driving circuit on the base substrate 10. The embodiments of the present disclosure are not limited thereto. For example, as shown in FIG. 5A, the orthographic projection of the fourth power line VGL2 on the base substrate 10 overlaps with wirings of the first conductive layer 320, for example, the orthographic projection of the fourth power line VGL2 on the base substrate 10 partially overlaps with a wiring connecting the gate electrode of the eighth transistor T8, a wiring connecting the gate electrode of the tenth transistor T10, and the first electrode CE12 of the second capacitor C2.

For example, each shift register of the first scan driving circuit further comprises a fourth constituting transistor connected to the third power line VGL1 and a fifth constituting transistor connected to the fourth power line VGL2. For example, the third transistor T3 is an example of the fourth constituting transistor, and the tenth transistor T10 is an example of the fifth constituting transistor. Hereinafter, the present disclosure is described by taking a case that the third transistor T3 is the fourth constituting transistor and the tenth transistor T10 is the fifth constituting transistor as an example, and the embodiments of the present disclosure do not limit this case. The following embodiments are the same as those described herein and will not be described again.

For example, an orthographic projection of the third transistor T3 on the base substrate 10 is located on a side, away from the orthographic projection of the first signal line group 150 on the base substrate 10, of an orthographic projection of the third power line VGL1 on the base substrate 10, and is close to the orthographic projection of the third power line VGL1 on the base substrate 10. For example, an orthographic projection of the tenth transistor T10 on the base substrate 10 is located between the orthographic projection of the fourth power line VGL2 on the base substrate 10 and an orthographic projection of the second signal line group 160 on the base substrate 10, and is close to the orthographic projection of the fourth power line on the base substrate 10. That is, the third power line VGL1 is disposed at a position close to the third transistor T3, and the tenth transistor T10 is disposed at a position close to the fourth power line VGL2, so that the winding caused by the connection of the third transistor T3 and the tenth transistor T10 to one power line (for example, the third power line VGL1) or respectively to the third power line VGL1 and the fourth power line VGL2 located on the left side of the display substrate can be avoided, thereby avoiding the space of the display substrate in a vertical direction from being occupied due to the winding.

In at least one embodiment of the present disclosure, the first power line VGH1, the second power line VGH2, the third power line VGL1, and the fourth power line VGL2 are respectively disposed beside the transistors connected thereto, such that the winding caused by a reason that the respective transistors are connected to one power line can be avoided, thereby avoiding the space of the display substrate in a vertical direction from being occupied due to the winding, which is advantageous for achieving the design of the narrow frame.

In some other embodiments, the pixel array region 110 comprises a first display region and a second display region (not shown), and the first display region and the second display region are juxtaposed to each other and do not overlap, and the first scan driving circuit 130 is connected to the first display region to drive the first display region to display.

The display substrate further comprises a second scan driving circuit disposed in the peripheral region and located on a side of the base substrate. For example, the second scan driving circuit and the first scan driving circuit are sequentially arranged along a scan direction (such as, a column direction) of the pixel array region, and the second scan driving circuit is connected to the second display region to drive the second display region to display. For example, the second scan driving circuit comprises a plurality of cascaded second shift registers (e.g., comprising a first-stage shift register 132 as shown in FIG. 5B). For example, a structure of the second shift register and a structure of the first shift register are the same and both adopt the circuit structure of the shift register as shown in FIG. 1, of course, the structure of the second shift register and the structure of the first shift register may also be different, and the embodiments of the present disclosure do not limit the structure of the second shift register and the structure of the first shift register. For the sake of clarity and conciseness, the second shift register is also be simply referred to as a shift register below. The following embodiments are the same as those described herein, and similar portions will not be described again.

For example, the display substrate is a folded display substrate, and further comprises a fold line located between the first display region and the second display region. For example, the second resistor R2 is located in an extending direction of the fold line, and the extending direction of the fold line is perpendicular to an extending direction of the first signal line group 150 and an extending direction of the second signal line group 160, so that the fold line can extend through the entire display substrate, for example, the extending direction of the first signal line group 150 and the extending direction of the second signal line group 160 are a vertical direction as shown in FIG. 4, and the extending direction of the fold line is a horizontal direction.

For example, as shown in FIG. 5B, the second signal line group 160 further comprises a second trigger signal line ESTV2, the second trigger signal line ESTV2 is connected to a first-stage shift register 132 of the plurality of cascaded shift registers in the second scan driving circuit, to provide a second trigger signal to the first-stage shift register 132 in the second scan driving circuit. For example, the first trigger signal line ESTV1 and the second trigger signal line ESTN2 are adjacent and juxtaposed. The first trigger signal line ESTV1 and the second trigger signal line ESTV2 are juxtaposed and extended, an extension length of the first trigger signal line ESTV1 and an extension length of the second trigger signal line ESTV2 are identical to an arrangement length of the first scan driving circuit and an arrangement length of the second scan driving circuit, for example, the first trigger signal line ESTV1 and the second trigger signal line ESTV2 can extend through the entire display panel, thereby avoiding a case that a line resistor of the first trigger signal line ESTV1 and a line resistor of the second trigger signal line ESTV2 are different due to the length of the first trigger signal line ESTV1 and the length of the second trigger signal line ESTV2 being different, so as to affect the trigger signals respectively transmitted by the first trigger signal line ESTV1 and the second trigger signal line ESTV2. Correspondingly, for example, in a case where a plurality of scan driving circuits are included, the remaining trigger signal lines may also be adjacent to the first trigger signal line ESTV1 and the second trigger signal line ESTV2 and be juxtaposed, and extension lengths of the remaining trigger signal lines may be the same as the extension length of the first trigger signal line ESTV1 and the extension length of the second trigger signal line ESTV2.

It should be noted that FIG. 5B only schematically shows a last-stage shift register 131 of the first scan driving circuit and a first-stage shift register 132 of the second scan driving circuit, and the layout modes of other stages of shift registers may refer to the layout mode as shown in FIG. 5A, and details are not described herein again.

FIGS. 6B, 7B, 8, and 9B are plane diagrams showing wirings of respective layers of the first-stage shift register in the display substrate as shown in FIG. 5B, respectively. The display substrate provided by at least one embodiment of the present disclosure will be described in detail below with reference to FIGS. 5B-9B.

Figure 6B:
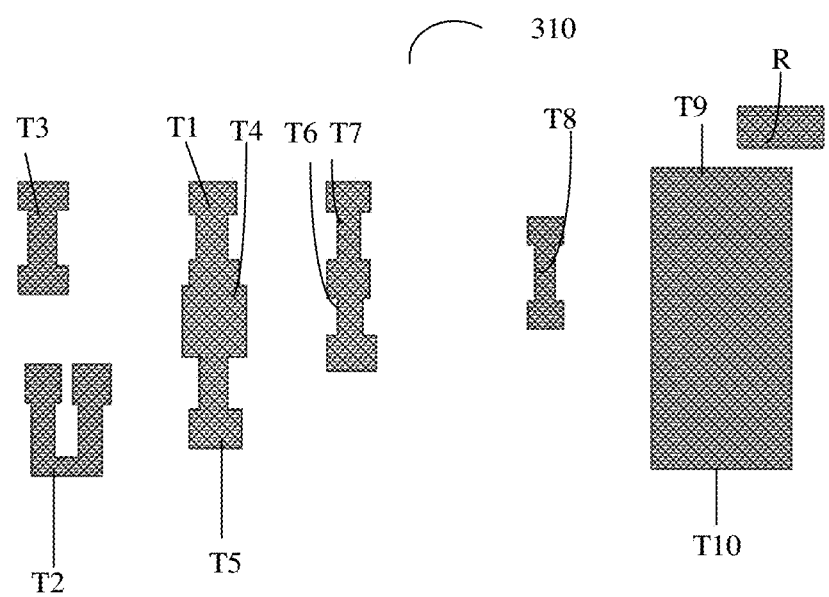
Figure 7B:
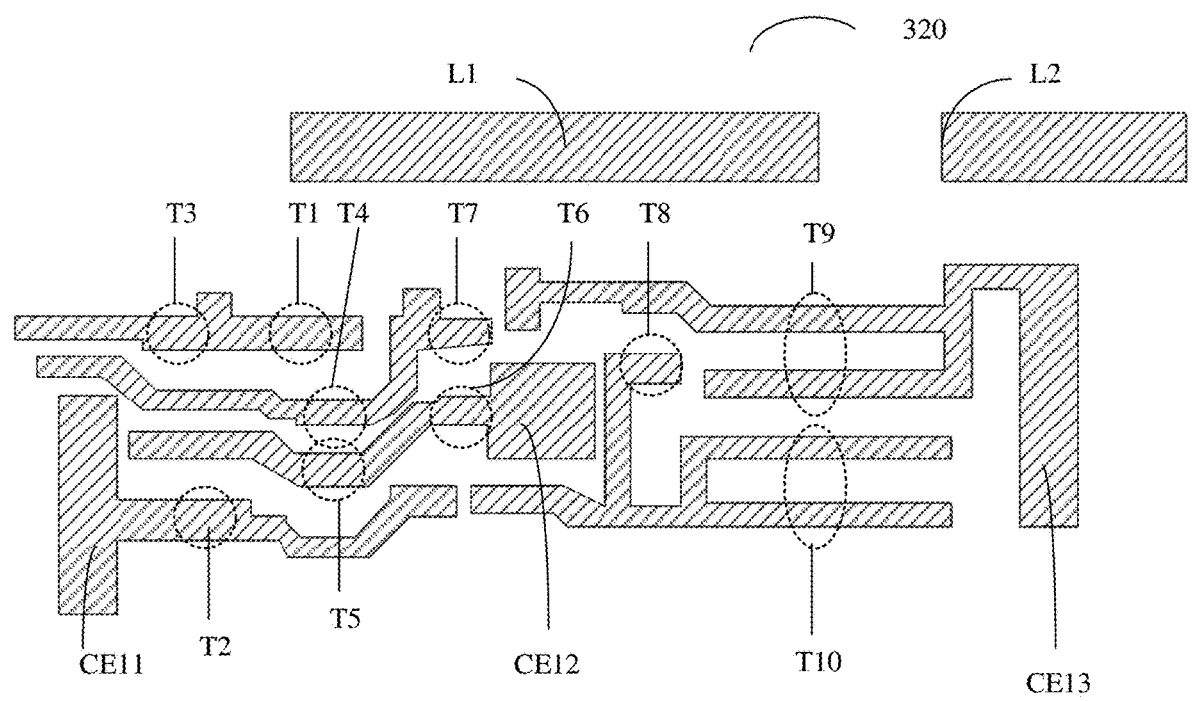
Figure 9B:
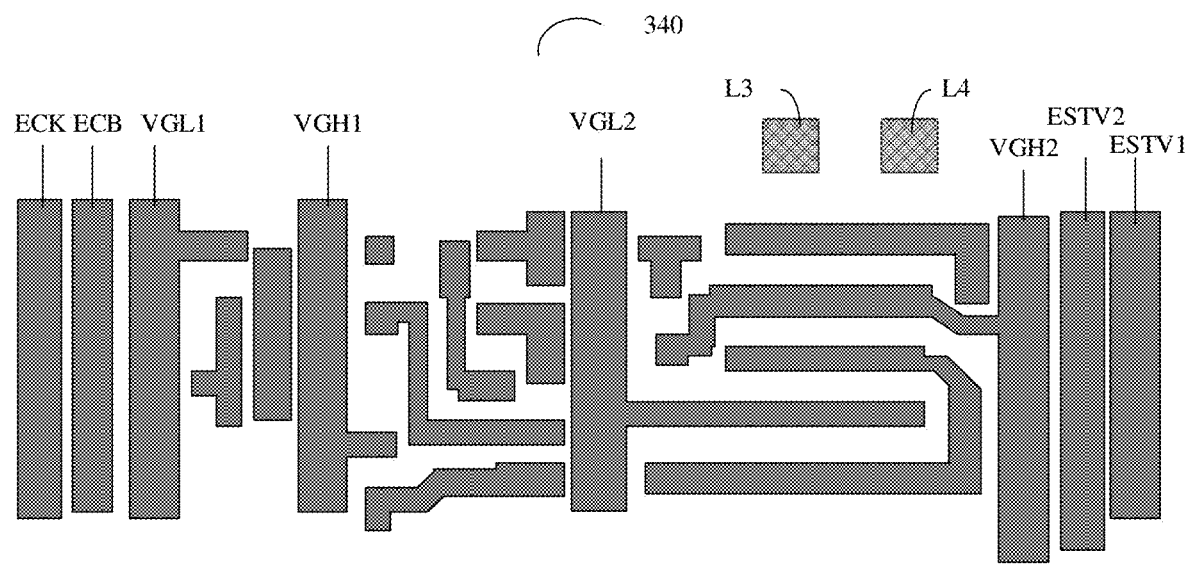

It should be noted that a semiconductor layer as shown in FIG. 6B is similar to the semiconductor layer as shown in FIG. 6A, the difference is that the semiconductor layer as shown in FIG. 6B further comprises at least one resistor (for example, the second resistor R2); a first conductive layer 320 as shown in FIG. 7B is similar to the first conductive layer 320 as shown in FIG. 7A, the difference is that the first conductive layer 320 as shown in FIG. 7B further comprises a first connection line L1 and a second connection line L2; and a third conductive layer 340 as shown in FIG. 9B is similar to the third conductive layer 340 as shown in FIG. 9A, the difference is that the third conductive layer 340 as shown in FIG. 9B further comprises a first conductive connection portion 341 and a second conductive connection portion 342, and the specific connection relationship will be described in detail below.

For example, in a case where the last-stage shift register 131 of the first scan driving circuit outputs an output signal, the second trigger signal line ESTV2 provides the second trigger signal to the first-stage shift register 132 of the second scan driving circuit to drive the plurality of cascaded shift registers in the second scan driving circuit to output the output signals row by row. It should be noted that, while the first trigger signal line ESTV1 provides the first trigger signal to the first scan driving circuit, the second trigger signal line ESTV2 also provides the second trigger signal to the second scan driving circuit, so that the first scan driving circuit and the second scan driving circuit can be simultaneously driven to operate, as long as pixel units in the pixel array region of the display substrate can be driven to display a normal image, and the embodiments of the present disclosure do not limit this case.

Figure 3:
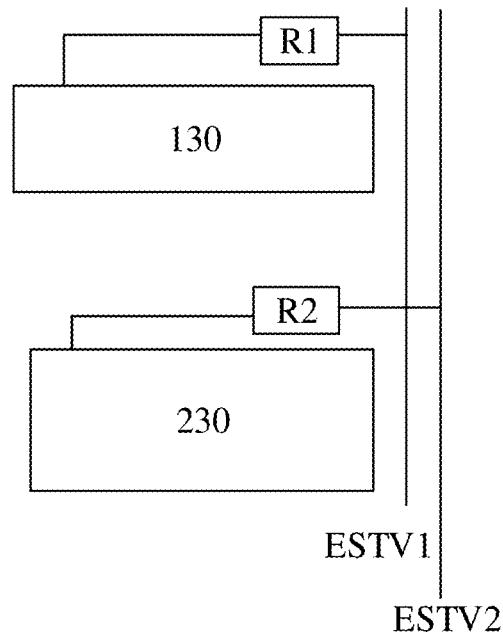
FIG. 3 is a schematic diagram of a first resistor and a second resistor provided by at least one embodiment of the present disclosure.

For example, in some examples, as shown in FIG. 3, the display substrate further comprises at least one first resistor R1 (shown in FIG. 3). For example, the first resistor R1 is located on a side, away from the first-stage first shift register, of the first scan driving circuit 130. For example, the first trigger signal line ESTV1 is connected to the first-stage shift register of the first scan driving circuit 130 (for example, to the first transistor T1 of the first-stage shift register) through the first resistor R1. For example, as shown in FIG. 5B, in a case where the display substrate comprises the second scan driving circuit 230, the display substrate may further comprise at least one second resistor R2. For example, the second resistor R2 is located between the last-stage first shift register of the first scan driving circuit 130 and the first-stage second shift register of the second scan driving circuit 230. For example, the second trigger signal line ESTV2 is connected to the first-stage second shift register of the second scan driving circuit 230 through the second resistor R2, for example, is connected to the first transistor T1 of the first-stage shift register 132 of the second scan driving circuit 230 through the second resistor R2.

For example, a resistance value of the first resistor R1 is different from a resistance value of the second resistor R2. For example, in some examples, the first trigger signal line ESTV1 is connected to a controller 20 from an upper side of the display substrate to receive the first trigger signal, the second trigger signal line ESTV2 passes through the middle of the display substrate and is connected to the controller to receive the second trigger signal, so that the line resistor (load) of the first trigger signal line ESTV1 and the line resistor of the second trigger signal line ESTV2 are different, and therefore, for example, in a case where the load of the first trigger signal line ESTV1 is greater than the load of the second trigger signal line ESTV2, the first resistor R1 is smaller than the second resistor R2, such that a sum of the resistance value of the line resistor of the first trigger signal line ESTV1 and the resistance value of the first resistor is approximately equal to the sum of the resistance value of the line resistor of the second trigger signal line ESTV2 and the resistance value of the second resistor. For example, in some examples, the resistance value of the first resistor R1 is 5000Ω, the resistance value of the second resistor R2 is 5500Ω, the resistance value of the line resistor of the first trigger signal line ESTV1 is 1000Ω, and the resistance value of the line resistor of the second trigger signal line ESTV2 is 500Ω.

It should be noted that, in a case where the display substrate comprises a plurality of scan driving circuits, the display substrate may further comprise a plurality of resistors which are used to respectively connect the first-stage shift registers of the plurality of scan driving circuits to the corresponding trigger signal lines. For example, in a case where the display substrate comprises a plurality of scan driving circuits such as a third scan driving circuit and a fourth scan driving circuit, correspondingly, the display substrate further comprises a third resistor connected to a first transistor T1 of a first-stage shift register of the third scan driving circuit, a fourth resistor connected to a first transistor T1 of a first-stage shift register of the fourth scan driving circuit, and the like, and the embodiments of the present disclosure are not limited thereto. For example, the setting of the remaining resistors can refer to the settings of the first resistor R1 and the second resistor R2, and details are not described herein again.

For example, the first resistor and the second resistor may be the same or different, which may be determined according to actual conditions, and the embodiments of the present disclosure do not limit this case. For example, a material of the first resistor and a material of the second resistor may include a semiconductor material, and the first resistor and the second resistor may be disposed in the same layer as the active layer of the transistor. For example, the first resistor and the second resistor are located in the semiconductor layer as shown in FIG. 6B.

Because a connection mode of the second resistor is shown in FIG. 5B, the second resistor R2 as shown in FIG. 5B will be described below as an example. FIG. 10 is a cross-sectional view of the display substrate as shown in FIG. 5B taken along a line A-A'. The connection mode of each resistor will be described in detail below with reference to FIG. 5B and FIG. 10 by taking the second resistor as an example.

As shown in FIG. 5B and FIG. 10, the second resistor R2 is located between the base substrate 10 and the second signal line group 160 (that is, located in the semiconductor layer 310) in a direction perpendicular to the base substrate 10, and the orthographic projection of the second resistor R2 on the base substrate 10 is located on a side, away from the pixel array region, of the orthographic projection of the second signal line group 160 on the base substrate 10. Correspondingly, the first resistor is located between the base substrate 10 and the second signal line group 160 (that is, located in the semiconductor layer 310) in the direction perpendicular to the base substrate 10, and the orthographic projection of the first resistor on the base substrate 10 is located on a side, away from the pixel array region, of the orthographic projection of the second signal line group 160 on the base substrate 10. It should be noted that the first resistor R1 and the second resistor R2 may also be disposed at other suitable positions, and are not limited to be disposed at the positions as shown in FIG. 5B, as long as the first resistor R1 and the second resistor R2 are located at positions where it is convenient to connect the trigger signal line and the first transistor T1, and the embodiments of the present disclosure do not limit the positions of the first resistor R1 and the second resistor R2.

As shown in FIG. 5B, the display substrate further comprises at least one first connection line L1 and at least one second connection line L2. The first connection line L1 connects one terminal of the second resistor R2 with the first-stage shift register (for example, the first transistor T1) of the second scan driving circuit, and the second connection line L2 connects the other terminal of the second resistor R2 with the second trigger signal line ESTV2.

It should be noted that the display substrate further comprises a plurality of first connection lines which are in one-to-one correspondence to the resistors corresponding to the other scanning driving circuits and a plurality of second connection lines which are in one-to-one correspondence to the resistors corresponding to the other scanning driving circuits, the first resistor or the other resistor is respectively connected to a corresponding scan driving circuit and a corresponding trigger signal line through a first connection line and a second connection line corresponding to the first resistor or the other resistor, for example, the first connection line connects one terminal of the first resistor to the first-stage shift register of the first scan driving circuit, and the second connection line connects the other terminal of the first resistor to the first trigger signal line, and details are not described herein again.

For example, the first connection line L1 and the second connection line L2 are located on a side, away from the base substrate 10, of the second resistor R2, that is, the first connection line L1 and the second connection line L2 are located in the first conductive layer 320 as shown in FIG. 7B, thereby avoiding a phenomenon of signal disorder due to a reason that the first connection line L1 and the second connection line L2 are intersected with the fourth power line VGL2 in a case where the first connection line L1 and the second connection line L2 are disposed in the third conductive layer 340.

For example, the display substrate further comprises at least one first conductive connection portion L3 and at least one second conductive connection portion L4, such that the respective resistors are connected to the first connection line and the second connection line in a bright manner. For example, the first conductive connection portion L3 and the second conductive connection portion L4 are located on a side, away from the base substrate 10, of the first connection line L1 and the second connection line L2, and are disposed in the same layer as the plurality of power lines 140, the first signal line group 150, and the second signal line 160, that is, the first conductive connection portion L3 and the second conductive connection portion L4 are located in the third conductive layer 340 as shown in FIG. 9B.

For example, as described above, the display substrate 1 further comprises a first insulation layer 350, a second insulation layer 360, and a third insulation layer 370. For example, the first insulation layer 350 is located between the second resistor R2 (i.e., the semiconductor layer 310) and the first connection line L1 or between the second resistor R2 and the second connection line L2 (the first conductive layer 320) in a direction perpendicular to the base substrate 10, and the second insulation layer 360 is located between the first connection line L1 and the first conductive connection portion L3, or between the first connection line L1 and the second conductive connection portion L4, or between the second connection line L2 (i.e., the first conductive layer 320) and the first conductive connection portion L3, or between the second connection line L2 and the second conductive connection portion L4 (that is, the third conductive layers 340) in the direction perpendicular to the base substrate 10. It should be noted that a second conductive layer 330 as shown in FIG. 8 and a third insulation layer 370 between the second conductive layer 330 and the third conductive layer 340 are further included between the second insulation layer 360 and the third conductive layer 340. The detailed introduction may refer to the above description and will not be repeated herein again.

For example, as shown in FIG. 5B and FIG. 10, one terminal of the first conductive connection portion L3 is connected to one terminal of the first connection line L1 through a hole 133 penetrating through the second insulation layer 360 (and the third insulation layer 370), and the other terminal of the first conductive connection portion L3 is connected to one terminal of the second resistor R2 through a hole 134 penetrating through the first insulation layer 350 and the second insulation layer 360 (and the third insulation layer 370). For example, the other terminal of the first connection line L1 is connected to the first-stage shift register of the first scan driving circuit (e.g., a source electrode S1 of the first transistor T1) through a hole 135 penetrating through the second insulation layer 360 and the third insulation layer 360 and a hole 139 penetrating through the first insulation layer 350, the second insulation layer 360, and the third insulation layer 370. For example, in a case where the orthographic projection of the other terminal of the first connection line L1 on the base substrate 10 at least partially overlaps with the orthographic projection of the source electrode S1 of the first transistor T1 on the base substrate 10, the other terminal of the first connection line L1 may also be connected to the source electrode S1 of the first transistor T1 through a hole (not shown) penetrating through the first insulation layer 350, and the embodiments of the present disclosure are not limited thereto.

One terminal of the second conductive connection portion L4 is connected to one terminal of the second connection line L2 through a hole 136 penetrating through the second insulation layer 350 (and the third insulation layer 360), and the other terminal of the second conductive connection portion L4 is connected to the other terminal of the second resistor R2 through a hole 137 penetrating through the first insulation layer 350 and the second insulation layer 360 (and the third insulation layer 370). The other terminal of the second connection line L2 is connected to the second trigger signal line ESTV2 through a hole 138 penetrating through the second insulation layer 360 and the third insulation layer 370.

It should be noted that the display substrate further comprises a plurality of first conductive connection portions which are in one-to-one correspondence to the resistors corresponding to the other scanning driving circuits and a plurality of second conductive connection portions which are in one-to-one correspondence to the resistors corresponding to the other scanning driving circuits, the first resistor or the other resistor is respectively connected to a corresponding first connection line and a corresponding second connection line through a first conductive connection portion and a second conductive connection portion corresponding to the first resistor or the other resistor, and details are not described herein again.

For example, one terminal of the first conductive connection portion is connected to one terminal of the first connection line through a hole penetrating through the second insulation layer, the other terminal of the first conductive connection portion is connected to one terminal of the first resistor through a hole penetrating through the first insulation layer and the second insulation layer, and the other terminal of the first connection line is connected to the first-stage shift register of the first scan driving circuit; one terminal of the second conductive connection portion is connected to one terminal of the second connection line through a hole penetrating through the second insulation layer, the other terminal of the second conductive connection portion is connected to the other terminal of the first resistor through a hole penetrating through the first insulation layer and the second insulation layer, and the other terminal of the second connection line is connected to the first trigger signal line through a hole penetrating through the second insulation layer.

In the embodiment of the present disclosure, the first-stage shift register of each scan driving circuit is connected to a corresponding trigger signal through a resistor, so that the influence of static electricity generated at the moment of energizing the device on the respective signals (for example, a trigger signal, a clock signal, etc.) can be avoided, so that the output signal outputted by the scan driving circuit can be more precise, and the display quality of the display panel is improved.

Figure 11:
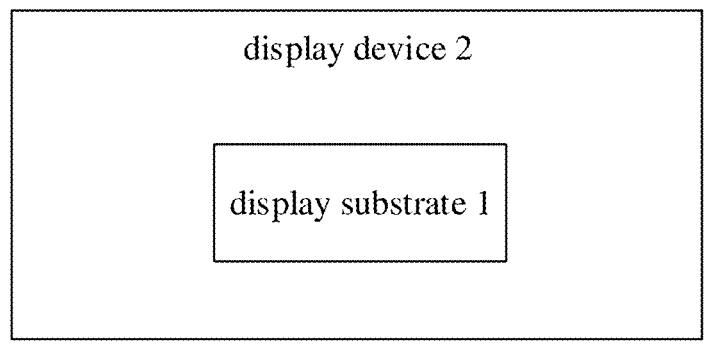
FIG. 11 is a schematic diagram of a display device provided by at least one embodiment of the present disclosure.

At least one embodiment of the present disclosure also provides a display device. FIG. 11 is a schematic diagram of a display device according to at least one embodiment of the present disclosure. As shown in FIG. 11, the display device 2 comprises a display substrate 1 provided by any one of the embodiments of the present disclosure, for example, the display substrate 1 as shown in FIG. 4, FIG. 5A, or FIG. 5B.

It should be noted that the display device 2 can be an OLED panel, an OLED television, a mobile phone, a tablet computer, a notebook computer, a digital photo frame, a navigator, and any products or components having a display function. The display device 2 may also comprise other components, and the embodiments of the present disclosure do not limit the specific type and structure of the display device 2.

It should be noted that for the sake of clarity and conciseness, the embodiments of the present disclosure do not describe all of the constituent units of the display device. In order to achieve the basic function of the display device, those skilled in the art can provide and set other structures not shown according to specific needs, and the embodiments of the present disclosure are not limited thereto.

The technical effects of the display device 2 provided by the above embodiments may refer to the technical effects of the display substrate 1 provided in the embodiments of the present disclosure, and details are not described herein again.

Figure 12:
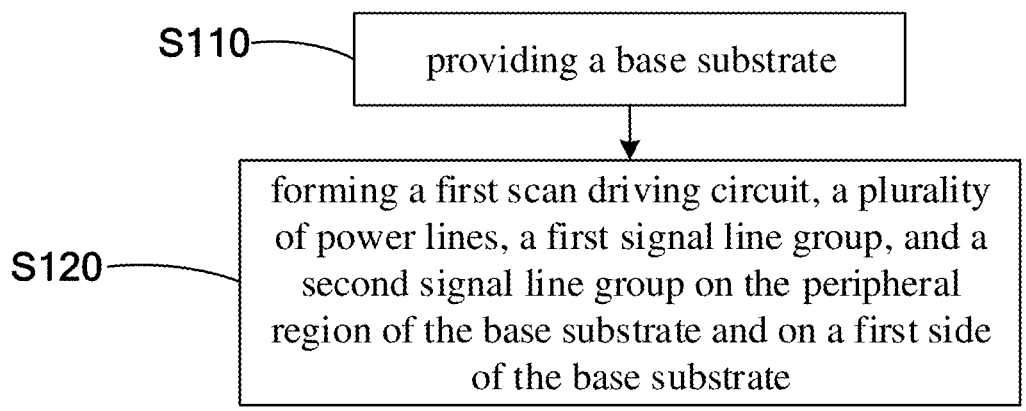
FIG. 12 is a flowchart of a manufacturing method of a display substrate provided by at least one embodiment of the present disclosure.

At least one embodiment of the present disclosure also provides a manufacturing method of a display substrate. FIG. 12 is a flowchart of a manufacturing method of a display substrate according to at least one embodiment of the present disclosure. For example, the manufacturing method can be used to manufacture the display substrate provided by any one of the embodiments of the present disclosure, for example, can be used to manufacture the display substrate as shown in FIG. 5A or FIG. 5B.

As shown in FIG. 12, the manufacturing method of the display substrate comprises steps S110 to S120.

S110: providing a base substrate.

S120: forming a first scan driving circuit, a plurality of power lines, a first signal line group, and a second signal line group on the peripheral region of the base substrate and on a first side of the base substrate.

For step S110, for example, the base substrate 10 may be made of, for example, glass, plastic, quartz, or other suitable material, and the embodiments of the present disclosure do not limit the material of the base substrate 10. For example, the base substrate 10 comprises a pixel array region 110 and a peripheral region 120.

For step S120, for example, the first scan driving circuit 130, the plurality of power lines 140, the first signal line group 150, and the second signal line group 160 are disposed in the peripheral region 120 and are located on the first side of the base substrate 10, for example, on a left side of the base substrate 10.

For example, the first scan driving circuit 130 comprises a plurality of cascaded shift registers 100, for example, comprises a plurality of shift registers as shown in FIG. 1. For example, a first transistor T1 to a tenth transistor T10 of the shift register may be formed in the semiconductor layer 310 as shown in FIG. 6A. For example, the material of the semiconductor layer 310 may comprise an oxide semiconductor, an organic semiconductor, or amorphous silicon, polysilicon, or the like, for example, the oxide semiconductor comprises a metal oxide semiconductor (for example, indium gallium zinc oxide (IGZO)), and the polysilicon comprises low-temperature polysilicon or high-temperature polysilicon, and the like, and the embodiments of the present disclosure do not limit the material of the semiconductor layer 310. It should be noted that the above-mentioned source region and drain region may be regions doped with an n-type impurity or a p-type impurity, and the embodiments of the present disclosure are not limited thereto.

For example, the first electrodes CE11, CE12, CE13 of the first capacitor C1 to the third capacitor C3 and the gate electrodes of the first transistor T1 to the tenth transistor T10 may be formed in the first conductive layer 320 as shown in FIG. 7A. As shown in FIG. 7A, the gate electrodes of the first transistor T1 to the tenth transistor T10 are respectively overlapping portions of the semiconductor layer structures of the respective transistors and the wirings in the first conductive layer 320.

For example, the second electrodes CE21, CE22, CE23 of the first capacitor C1 to the third capacitor C3 may be formed in the second conductive layer 330 as shown in FIG. 8. For example, the second electrode CE21 at least partially overlaps with the first electrode CE11 to form the first capacitor C1, the second electrode CE22 at least partially overlaps with the first electrode CE12 to form the second capacitor C2, and the second electrode CE23 at least partially overlaps with the first electrode CE13 to form the third capacitor C3.

For example, the plurality of power lines 140, the first signal line group 150, and the second signal line group 160 may be formed in the third conductive layer 340 as shown in FIG. 9A. It should be noted that the third conductive layer further comprises conductive connection portions for connecting the respective transistors, the capacitors, and the signal lines. As shown in FIGS. 5A and 9A, the first signal line group 150, the plurality of power lines 140, and the second signal line group 160 are connected to transistors, which need to be connected to the first signal line group 150, the plurality of power lines 140, and the second signal line group 160, in the remaining layers through at least one hole, and the transistors are also connected through at least one hole or are bridge-connected through conductive connection portions, and details will not be described herein.

For example, a material of the above-described third conductive layer 340 may comprise aluminum, aluminum alloy, copper, copper alloy, or any other suitable material, which is not limited by the embodiment of the present disclosure. For example, a material of the first conductive layer 320 and a material of the second conductive layer 330 may be the same as a material of the third conductive layer 340, and details are not described herein.

For example, the plurality of power lines 140 are configured to provide power voltages to the plurality of cascaded shift registers 100 in the first scan driving circuit 130. For example, a first power voltage (such as, having a DC high level), a second power voltage (such as, having a DC low level), and the like are provided.

For example, the first signal line group 150 comprises at least one timing signal line, for example, comprises a first clock signal line ECK and a second clock signal line ECB, and the at least one timing signal line is configured to provide timing signals, such as the first clock signal ECK and the second clock signal ECB described above, to the plurality of cascaded shift registers 100 in the first scan driving circuit 130.

For example, in at least one example, the second signal line group 160 comprises a first trigger signal line ESTV1 configured to be connected to a first-stage shift register in the plurality of cascaded shift registers 100 in the first scan driving circuit 150 and to provide a first trigger signal to the first-stage shift register. For example, the first trigger signal line ESTV1 is located between the plurality of power lines 140 and the pixel array region 110.

In some embodiments, as shown in FIG. 4 or FIG. 5A, the second signal line group 160 is formed on a side of the first scan driving circuit 130 adjacent to the pixel array region 110, and the first signal line group 150 is formed on the other side of the first scan driving circuit 130 opposite to the side where the second signal line group 160 is located. For example, as shown in FIG. 4 or FIG. 5A, the second signal line group 160 is located on the right side of the shift register 100, and the first signal line group 150 is located on the left side of the shift register 100.

In this embodiment, by disposing the first trigger signal line ESTV1 on the right side of the shift register, that is, the first trigger signal line ESTV1 is disposed separately from the first signal line group 150 and the plurality of power lines 140, so as to avoid the dense wirings caused by too many signal lines disposed on the left side, thereby avoiding the problem that the space left for the trigger signal lines is too small due to the dense lines to affect the introduction of other signal lines.

For example, the step S120 further comprises forming a first power line VGH1, a second power line VGH2, a third power line VGL1, and a fourth power line VGL2 on the base substrate 10, and forming a fifth transistor T5 connected to the first power line VGH1, an eighth transistor T8 and a ninth transistor T9 connected to the second power line VGH2, a third transistor T3 connected to the third power line VGHL1, and a tenth transistor T10 connected to the fourth power line VGL2 on the base substrate 10. For example, the first power line VGH1 and the second power line VGH2 provide the same first power voltage, for example, a DC high voltage.

For example, an orthographic projection of the first power line VGH1 on the base substrate 10 partially overlaps with an orthographic projection of the first scan driving circuit on the base substrate 10; and an orthographic projection of the second power line VGH2 on the base substrate 10 is located between the orthographic projection of the first power line VGH1 on the base substrate 10 and an orthographic projection of the second signal line group 160 on the base substrate 10.

For example, the first power line VGH1 is formed at a position close to the fifth transistor T5, and the second power line VGH2 is formed at a position close to the eighth transistor T8 and the ninth transistor T9, so that the winding caused by the connection of the fifth transistor T5, the eighth transistor T8, and the ninth transistor T9 to one power line (for example, the first power line VGH1) can be avoided, thereby avoiding the space of the display substrate in a vertical direction from being occupied due to the winding.

For example, the third power line VGL1 and the fourth power line VGL2 are configured to provide the same second power voltage, for example, a DC low voltage. For example, the first power voltage is higher than the second power voltage. For example, an orthogonal projection of the fourth power line VGL2 on the base substrate 10 partially overlaps with an orthographic projection of the first scan driving circuit on the base substrate 10, an orthographic projection of the third power line VGL1 on the base substrate 10 is located between the orthographic projection of the first power line VGH1 on the base substrate 10 and the orthographic projection of the first signal line group 150 on the substrate base 10.

For example, the third power line VGL1 is formed at a position close to the third transistor T3, and the fourth power line VGL2 is formed at a position close to the tenth transistor T10, so that the winding caused by the connection of the third transistor T3 and the tenth transistor T10 to one power line (for example, the third power line VGL1) or respectively to the third power line VGL1 and the fourth power line VGL2 located on the left side of the display substrate can be avoided, thereby avoiding the space of the display substrate in a vertical direction from being occupied due to the winding.

For example, in some examples, the manufacturing method of the display substrate further comprises: forming a second scan driving circuit in the peripheral region and on the first side of the base substrate 10. For example, the second scan driving circuit comprises a plurality of cascaded shift registers (e.g., comprises a first-stage shift register 132 shown in FIG. 5B). For example, as shown in FIG. 5B, the second signal line group 160 further comprises a second trigger signal line ESTV2, and the second trigger signal line ESTV2 is connected to the first-stage shift register 132 of the plurality of cascaded shift registers in the second scan driving circuit to provide a second trigger signal to the first-stage shift register 132 in the second scan driving circuit.

For example, an extension length of the first trigger signal line ESTV1 and an extension length of the second trigger signal line ESTV2 are identical to an arrangement length of the first scan driving circuit and an arrangement length of the second scan driving circuit, thereby avoiding a case that a line resistor of the first trigger signal line ESTV1 and a line resistor of the second trigger signal line ESTV2 are different due to the length of the first trigger signal line ESTV1 and the length of the second trigger signal line ESTV2 being different, so as to affect the trigger signals respectively transmitted by the first trigger signal line ESTV1 and the second trigger signal line ESTV2. Correspondingly, for example, in a case where a plurality of scan driving circuits are included, extension lengths of the remaining trigger signal lines may be the same as the extension length of the first trigger signal line ESTV1 and the extension length of the second trigger signal line ESTV2.

For example, in some examples, the manufacturing method of the display substrate further comprises: forming at least one first resistor and at least one second resistor between the base substrate 10 and the second signal line group 160 in a direction perpendicular to the base substrate 10.

It should be noted that in a case where the display substrate comprises a plurality of scan driving circuits (for example, a third scan driving circuit, a fourth scan driving circuit, and the like), the manufacturing method of the display substrate further comprises: forming resistors corresponding to the plurality of scan driving circuits between the base substrate 10 and the second signal line group in the direction perpendicular to the base substrate 10, and the embodiments of the present disclosure are not limited thereto.

As shown in FIG. 5B and FIG. 10, the second resistor R2 is located between the base substrate 10 and the second signal line group 160 (i.e., located in the semiconductor layer 310) in the direction perpendicular to the base substrate 10, and the orthographic projection of the second resistor R2 on the base substrate 10 is located on the side, away from the pixel array region, of the orthographic projection of the second signal line group 160 on the base substrate 10. Correspondingly, the first resistor is located between the base substrate 10 and the second signal line group 160 in the direction perpendicular to the base substrate 10, and the orthographic projection of the first resistor on the base substrate 10 is located on a side, away from the pixel array region, of the orthographic projection of the second signal line group 160 on the base substrate 10. It should be noted that the first resistor R1 and the second resistor R2 may also be disposed at other suitable positions, and are not limited to be disposed at the positions as shown in FIG. 5B.

For example, in some examples, the manufacturing method of the display substrate further comprises: forming at least one first connection line and at least one second connection line on a side, away from the base substrate 10, of the first resistor R1 and the second resistor R2, that is, in the first conductive layer 320. Therefore, a phenomenon of signal disorder due to a reason that the first connection line and the second connection line are intersected with the fourth power line VGL2 in a case where the first connection line and the second connection line are disposed in the third conductive layer 340 can be avoided.

For example, the first connection line connects one terminal of the first resistor to the first-stage shift register of the first scan driving circuit, and the second connection line connects the other terminal of the first resistor to the first trigger signal line; and the first connection line L1 connects one terminal of the second resistor R2 with the first-stage shift register of the second scan driving circuit (for example, the first transistor T1), and the second connection line L2 connects the other terminal of the second resistor R2 with the second trigger signal line ESTV2.

For example, in some examples, the manufacturing method of the display substrate further comprises: forming a first conductive connection portion L3 and a second conductive connection portion, which are disposed in the same layer as the plurality of power lines 140, the first signal line group 150, and the second signal line group 160, on the base substrate 10; forming a first insulation layer 350 between the first resistor R1 (i.e., the semiconductor layer 310) and the first connection line L1 or between the first resistor R1 and the second connection line L2 (the first conductive layer 320) in the direction perpendicular to the base substrate 10; and forming a second insulation layer 360 between the first connection line L1 and the first conductive connection portion L3, or between the first connection line L1 and the second conductive connection portion L4, or between the second connection line L2 (the first conductive layer 320) and the first conductive connection portion L3, or between the second connection line L2 and the second conductive connection portion L4 (that is, the third conductive layer 340) in the direction perpendicular to the base substrate 10. It should be noted that the manufacturing method of the display substrate further comprises forming a second conductive layer 330 as shown in FIG. 8 between the second insulation layer 360 and the third conductive layer 340 and forming a third insulation layer 370 between the second conductive layer 330 and the third conductive layer 340, detail descriptions may refer to the above description, and similar portions are not described herein again.

For example, as shown in FIG. 5B and FIG. 10, one terminal of the first conductive connection portion L3 is connected to one terminal of the first connection line L1 through a hole 133 penetrating through the second insulation layer 360 (and the third insulation layer 370), and the other terminal of the first conductive connection portion L3 is connected to one terminal of the second resistor R2 through a hole 134 penetrating through the first insulation layer 350 and the second insulation layer 360 (and the third insulation layer 370). For example, the other terminal of the first connection line L1 is connected to the first-stage shift register of the first scan driving circuit (e.g., a source electrode S1 of the first transistor T1) through a hole 135 penetrating through the second insulation layer 360 and the third insulation layer 360 and a hole 139 penetrating through the first insulation layer 350, the second insulation layer 360, and the third insulation layer 370. For example, in a case where the orthographic projection of the other terminal of the first connection line L1 on the base substrate 10 at least partially overlaps with the orthographic projection of the source electrode S1 of the first transistor T1 on the base substrate 10, the other terminal of the first connection line L1 may also be connected to the source electrode S1 of the first transistor T1 through a hole (not shown) penetrating through the first insulation layer 350, and the embodiments of the present disclosure are not limited thereto.

One terminal of the second conductive connection portion L4 is connected to one terminal of the second connection line L2 through a hole 136 penetrating through the second insulation layer 350 (and the third insulation layer 360), and the other terminal of the second conductive connection portion L4 is connected to the other terminal of the second resistor R2 through a hole 137 penetrating through the first insulation layer 350 and the second insulation layer 360 (and the third insulation layer 370). The other terminal of the second connection line L2 is connected to the second trigger signal line ESTV2 through a hole 138 penetrating through the second insulation layer 360 and the third insulation layer 370.

In the embodiment of the present disclosure, the first-stage shift register of each scan driving circuit is connected to a corresponding trigger signal through a resistor, so that the influence of static electricity generated at the moment of energizing the device on the respective signals (for example, a trigger signal, a clock signal, etc.) can be avoided, so that the output signal outputted by the scan driving circuit can be more precise, and the display quality of the display panel is improved.

It should be noted that, in various embodiments of the present disclosure, the process of the manufacturing method of the display substrate may comprise more or fewer operations, and these operations may be performed sequentially or in parallel. Although the process of the manufacturing method described above comprises a plurality of operations occurring in a specific order, it should be clearly understood that the order of the plurality of operations is not limited. The manufacturing method described above may be performed once or may also be performed multiple times according to predetermined conditions.

The technical effects of manufacturing method of the display substrate provided by the above embodiments may refer to the technical effects of the display substrate provided in the embodiments of the present disclosure, and details are not described herein again.

The following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiment(s) can be combined with each other to obtain new embodiment(s).

What have been described above are only exemplary implementations of the present disclosure and are not intended to limit the protection scope of the present disclosure, and the protection scope of the present disclosure should be based on the protection scope of the appended claims.

What is claimed is:

1. A display substrate, comprising:
a base substrate, comprising a pixel array region and a peripheral region; and
a first scan driving circuit, a plurality of power lines, a first signal line group, and a second signal line group, which are in the peripheral region and located on a first side of the base substrate,
wherein the first scan driving circuit comprises a plurality of cascaded first shift registers;
the plurality of power lines are configured to provide a plurality of power voltages to the plurality of cascaded first shift registers in the first scan driving circuit;
the first signal line group comprises at least one timing signal line configured to provide at least one timing signal to the plurality of cascaded first shift registers in the first scan driving circuit;
the second signal line group comprises a first trigger signal line configured to be connected to a first-stage first shift register of the plurality of cascaded first shift registers in the first scan driving circuit and to provide a first trigger signal to the first-stage first shift register; and
the first trigger signal line is between the plurality of power lines and the pixel array region;
wherein the plurality of power lines comprise a first power line and a second power line, and
the first power line and the second power line are configured to provide a same first power voltage;
wherein an orthographic projection of the first power line on the base substrate partially overlaps with an orthographic projection of the first scan driving circuit on the base substrate; and
an orthographic projection of the second power line on the base substrate is between the orthographic projection of the first power line on the base substrate and an orthographic projection of the second signal line group on the base substrate.

2. The display substrate according to claim 1, wherein the second signal line group is on a side of the first scan driving circuit adjacent to the pixel array region, and
the first signal line group is on a side of the first scan driving circuit opposite to the side of the first scan driving circuit where the second signal line group is located.

3. The display substrate according to claim 1, wherein the pixel array region comprises a first display region and a second display region, and the first display region and the second display region are juxtaposed to each other and do not overlap with each other, the first scan driving circuit is connected to the first display region to drive the first display region to display,
the display substrate further comprises a second scan driving circuit in the peripheral region and located on the first side of the base substrate, the second scan driving circuit and the first scan driving circuit are sequentially arranged along a scan direction of the pixel array region, and the second scan driving circuit is connected to the second display region to drive the second display region to display, wherein the second scan driving circuit comprises a plurality of cascaded second shift registers, the second signal line group further comprises a second trigger signal line configured to be connected to a first-stage second shift register of the plurality of cascaded second shift registers in the second scan driving circuit and to provide a second trigger signal to the first-stage second shift register in the second scan driving circuit.

4. The display substrate according to claim 3, wherein an extension length of the first trigger signal line and an extension length of the second trigger signal line are identical to an arrangement length of the first scan driving circuit and an arrangement length of the second scan driving circuit;

wherein the first trigger signal line and the second trigger signal line are juxtaposed.

5. The display substrate according to claim 3, further comprising at least one first resistor, wherein the first resistor is on a side, away from the first-stage first shift register, of the first scan driving circuit, and the first trigger signal line is connected to the first-stage first shift register of the first scan driving circuit through the at least one first resistor.

6. The display substrate according to claim 5, further comprising at least one second resistor, wherein the second resistor is between a last-stage first shift register of the first scan driving circuit and the first-stage second shift register of the second scan driving circuit, and the second trigger signal line is connected to the first-stage second shift register of the second scan driving circuit through the at least one second resistor;

a resistance value of the first resistor is different from a resistance value of the second resistor.

7. The display substrate according to claim 6, further comprising a fold line between the first display region and the second display region, wherein the second resistor is located in an extending direction of the fold line, and the extending direction of the fold line is perpendicular to an extending direction of the first signal line group and an extending direction of the second signal line group.

8. The display substrate according to claim 6, wherein an orthographic projection of the at least one second resistor on the base substrate is between an orthographic projection of the last-stage first shift register of the first scan driving circuit on the base substrate and an orthographic projection of the first-stage second shift register of the second scan driving circuit on the base substrate.

9. The display substrate according to claim 5, wherein the at least one first resistor is between the base substrate and the second signal line group in a direction perpendicular to the base substrate, and an orthographic projection of the at least one first resistor on the base substrate is on a side, away from the pixel array region, of an orthographic projection of the second signal line group on the base substrate.

10. The display substrate according to claim 5, wherein a material of the first resistor comprises a semiconductor material.

11. The display substrate according to claim 5, further comprising at least one first connection line and at least one second connection line, wherein the first connection line connects one terminal of the at least one first resistor to the first-stage first shift register of the first scan driving circuit, and the second connection line connects other terminal of the at least one first resistor to the first trigger signal line.

12. The display substrate according to claim 11, wherein the first connection line and the second connection line are on a side, away from the base substrate, of the at least one first resistor.

13. The display substrate according to claim 11, further comprising: a first conductive connection portion, a second conductive connection portion, a first insulation layer, and a second insulation layer, wherein the first conductive connection portion and the second conductive connection portion are on a side, away from the base substrate, of the first connection line and the second connection line, and are in a same layer as the plurality of power lines, the first signal line group, and the second signal line group;

the first insulation layer is between the at least one first resistor and the first connection line or between the at least one first resistor and the second connection line in a direction perpendicular to the base substrate, the second insulation layer is between the first connection line and the first conductive connection portion, or between the first connection line and the second conductive connection portion, or between the second connection line and the first conductive connection portion, or between the second connection line and the second conductive connection portion in the direction perpendicular to the base substrate;

one terminal of the first conductive connection portion is connected to one terminal of the first connection line through a hole penetrating through the second insulation layer, and other terminal of the first conductive connection portion is connected to one terminal of the at least one first resistor through a hole penetrating through the first insulation layer and the second insulation layer;

other terminal of the first connection line is connected to the first-stage first shift register of the first scan driving circuit;

one terminal of the second conductive connection portion is connected to one terminal of the second connection line through a hole penetrating through the second insulation layer, and other terminal of the second conductive connection portion is connected to other terminal of the at least one first resistor through a hole penetrating through the first insulation layer and the second insulation layer; and other terminal of the second connection line is connected to the first trigger signal line through a hole penetrating through the second insulation layer.

14. The display substrate according to claim 3, wherein each of the plurality of cascaded first shift registers of the first scan driving circuit comprises a first constituting transistor which is connected to the first power line and comprises a second constituting transistor and a third constituting transistor which are connected to the second power line, an orthographic projection of the first constituting transistor on the base substrate is between an orthographic projection of the first signal line group on the base substrate and an orthographic projection of the first power line on the base substrate, and is close to the orthographic projection of the first power line on the base substrate, an orthographic projection of the second constituting transistor on the base substrate and an orthographic projection of the third constituting transistor on the base substrate are between the orthographic projection of the first power line on the base substrate and an orthographic projection of the second power line on the base substrate, and is close to the orthographic projection of the second power line on the base substrate.

15. The display substrate according to claim 1, wherein the plurality of power lines comprise a third power line and a fourth power line, the third power line and the fourth power line are configured to provide a same second power voltage;

an orthographic projection of the fourth power line on the base substrate partially overlaps with an orthographic portion of the first scan driving circuit on the base substrate;

an orthographic projection of the third power line on the base substrate is between the orthographic projection of the fourth power line on the base substrate and an orthographic projection of the first signal line group on the base substrate.

16. The display substrate according to claim 15, wherein each of the plurality of cascaded first shift registers of the first scan driving circuit further comprises a fourth constituting transistor connected to the third power line and a fifth constituting transistor connected to the fourth power line, an orthographic projection of the fourth constituting transistor on the base substrate is on a side, away from the orthographic projection of the first signal line group on the base substrate, of the orthographic projection of the third power line on the base substrate, and is close to the orthographic projection of the third power line on the base substrate, an orthographic projection of the fifth constituting transistor on the base substrate is between the orthographic projection of the fourth power line on the base substrate and an orthographic projection of the second signal line group on the base substrate, and is close to the orthographic projection of the fourth power line on the base substrate.

17. A display device, comprising the display substrate according to claim 1.

18. A display substrate, comprising:

a base substrate, comprising a pixel array region and a peripheral region, a first scan driving circuit, a plurality of power lines, a first signal line group, and a second signal line group, which are in the peripheral region and located on a first side of the base substrate, wherein the first scan driving circuit comprises a plurality of cascaded first shift registers;

the plurality of power lines are configured to provide a plurality of power voltages to the plurality of cascaded first shift registers in the first scan driving circuit;

the first signal line group comprises at least one timing signal line configured to provide at least one timing signal to the plurality of cascaded first shift registers in the first scan driving circuit;

the second signal line group comprises a first trigger signal line configured to be connected to a first-stage first shift register of the plurality of cascaded first shift registers in the first scan driving circuit and to provide a first trigger signal to the first-stage first shift register, wherein the first scan driving circuit comprises a first transistor, a second transistor, and a third transistor, and the first transistor, the second transistor, and the third transistor are respectively connected to the first signal line group, an extending direction of a channel of the first transistor, an extending direction of a channel of the second transistor, and an extending direction of a channel of the third transistor are parallel to an extending direction of the first signal line group and an extending direction of the second signal line group.

19. The display substrate according to claim 18, wherein the first scan driving circuit further comprises a sixth transistor and a seventh transistor, and the sixth transistor and the seventh transistor are respectively connected to the first signal line group, an extending direction of a channel of the sixth transistor and an extending direction of a channel of the seventh transistor are parallel to the extending direction of the first signal line group and the extending direction of the second signal line group.

* * * * *